(12) United States Patent
Kim

(10) Patent No.: US 12,550,388 B2
(45) Date of Patent: Feb. 10, 2026

(54) SEMICONDUCTOR DEVICE INCLUDING 2D MATERIAL LAYERS

(71) Applicant: SAMSUNG ELECTRONICS CO., LTD., Suwon-si (KR)

(72) Inventor: Kijoon Kim, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 418 days.

(21) Appl. No.: 18/106,631

(22) Filed: Feb. 7, 2023

(65) Prior Publication Data

US 2023/0387279 A1 Nov. 30, 2023

(30) Foreign Application Priority Data

May 25, 2022 (KR) .................. 10-2022-0063975

(51) Int. Cl.
| | |
|---|---|
| *H10D 48/36* | (2025.01) |
| *H01L 21/02* | (2006.01) |
| *H10D 30/43* | (2025.01) |
| *H10D 30/67* | (2025.01) |
| *H10D 62/10* | (2025.01) |
| *H10D 62/80* | (2025.01) |
| *H10D 99/00* | (2025.01) |

(52) U.S. Cl.
CPC ..... *H10D 48/362* (2025.01); *H01L 21/02568* (2013.01); *H01L 21/02603* (2013.01); *H10D 30/43* (2025.01); *H10D 30/6735* (2025.01); *H10D 62/121* (2025.01); *H10D 62/80* (2025.01); *H10D 99/00* (2025.01)

(58) Field of Classification Search
CPC ........ H01L 21/02568; H01L 21/02485; H10D 30/6735; H10D 30/47
See application file for complete search history.

(56) References Cited

U.S. PATENT DOCUMENTS

| | | |
|---|---|---|
| 10,121,854 B2 | 11/2018 | Heo et al. |
| 10,388,732 B1 | 8/2019 | Frougier et al. |
| 10,644,168 B2 | 5/2020 | Colinge et al. |
| 10,672,894 B2 | 6/2020 | Van Houdt et al. |
| 10,741,646 B2 | 8/2020 | Yeh et al. |
| 10,950,736 B2 | 3/2021 | Moroz et al. |
| 11,031,510 B2 | 6/2021 | Hou et al. |

(Continued)

*Primary Examiner* — Nduka E Ojeh
(74) *Attorney, Agent, or Firm* — Muir Patent Law, PLLC

(57) ABSTRACT

A semiconductor device includes channel structures spaced apart in a vertical direction; lower/upper first gate insulation patterns contacting lower/upper surfaces of the channel structures; a gate electrode surrounding lower/upper surfaces and a sidewall of the channel structures; and source/drain layers at sides of the gate electrode, wherein the channel structures include first/second 2D material layers stacked in the vertical direction, the first 2D material layer includes a semiconducting TMD including a first transition metal and first chalcogen elements that are bonded at lower/upper sides of the first transition metal, the second 2D material layer includes a second transition metal and a second chalcogen element, the second chalcogen element being bonded at a lower side of the second transition metal, and the second transition metal included in the second 2D material layer is covalently or ionically bonded with an element of the upper first gate insulation pattern.

19 Claims, 20 Drawing Sheets

(56) References Cited

U.S. PATENT DOCUMENTS

| | | | |
|---|---|---|---|
| 2018/0151763 A1* | 5/2018 | Heo | H10D 64/62 |
| 2021/0074812 A1 | 3/2021 | Lu et al. | |
| 2021/0296445 A1 | 9/2021 | Lee et al. | |
| 2021/0359099 A1* | 11/2021 | Shen | B82Y 10/00 |
| 2021/0399138 A1 | 12/2021 | Jariwala et al. | |
| 2022/0270970 A1* | 8/2022 | Chan | H01L 23/53276 |
| 2023/0099814 A1* | 3/2023 | Maxey | H10D 64/512 |
| | | | 257/29 |
| 2023/0100451 A1* | 3/2023 | Maxey | H10D 64/513 |
| | | | 257/382 |

* cited by examiner

SEMICONDUCTOR DEVICE INCLUDING 2D MATERIAL LAYERS

CROSS-REFERENCE TO RELATED APPLICATION

This application claims priority under 35 USC § 119 to Korean Patent Application No. 10-2022-0063975, filed on May 25, 2022, in the Korean Intellectual Property Office (KIPO), the contents of which are herein incorporated by reference in their entirety.

BACKGROUND

1. Field

Embodiments relate to a semiconductor device.

2. Description of the Related Art

In a semiconductor device, a channel including silicon may be used. As the size of the semiconductor device decreases, electrical characteristics of the channel including silicon may be limited.

SUMMARY

The embodiments may be realized by providing a semiconductor device including a substrate; channel structures on the substrate, the channel structures being spaced apart from each other in a vertical direction substantially perpendicular to an upper surface of the substrate; a lower first gate insulation pattern contacting a lower surface of each of the channel structures; an upper first gate insulation pattern contacting an upper surface of each of the channel structures; a gate electrode on the substrate, the gate electrode surrounding lower and upper surfaces and a sidewall of a portion of each of the channel structures; and source/drain layers at opposite sides, respectively, of the gate electrode, wherein each of the channel structures includes a first 2D material layer and a second 2D material layer stacked in the vertical direction, the first 2D material layer includes a semiconducting transition metal dichalcogenide (TMD), the semiconducting TMD including a first transition metal and first chalcogen elements, the first chalcogen elements being bonded at a lower side of the first transition metal and being bonded at an upper side of the first transition metal, the second 2D material layer includes a second transition metal and a second chalcogen element, the second chalcogen element being bonded at a lower side of the second transition metal, and the second transition metal included in the second 2D material layer is bonded with an element included in the upper first gate insulation pattern by a covalent bond or an ionic bond.

The embodiments may be realized by providing a semiconductor device including a substrate; channels on the substrate, the channels being spaced apart from each other in a vertical direction substantially perpendicular to an upper surface of the substrate; a lower first gate insulation pattern contacting a lower side of each of the channels; an upper first gate insulation pattern contacting an upper side of each of the channels; a first contact layer between each of the channels and the upper first gate insulation pattern, the first contact layer contacting each of the channels and contacting the upper first gate insulation pattern; a gate electrode on the substrate, the gate electrode surrounding lower surfaces, upper surfaces, and a sidewall of a portion of each of the channels; and source/drain layers at opposite sides, respectively, of the gate electrode, wherein each of the channels includes a semiconducting transition metal dichalcogenide (TMD), the semiconducting TMD containing a first transition metal and first chalcogen elements, the first chalcogen elements being bonded at a lower side of the first transition metal and being bonded at an upper side of the first transition metal, and the first contact layer includes the first transition metal and the first chalcogen element, the first chalcogen element being bonded at a lower side of the first transition metal in the first contact layer.

The embodiments may be realized by providing a semiconductor device including a substrate; channel structures on the substrate, the channel structures being spaced apart from each other in a vertical direction substantially perpendicular to an upper surface of the substrate, and each of the channel structures having a first length in a first direction substantially parallel to the upper surface of the substrate; a lower first gate insulation pattern contacting a lower surface of each of the channel structures, the lower first gate insulation pattern having the first length in the first direction; an upper first gate insulation pattern contacting an upper surface of each of the channel structures, the upper first gate insulation pattern having the first length in the first direction; a gate electrode extending in a second direction substantially parallel to the upper surface of the substrate and crossing the first direction on the substrate, the gate electrode surrounding lower and upper surfaces and opposite sidewalls in the second direction of a central portion in the first direction of each of the channel structures; source/drain layers at opposite sides in the first direction, respectively, of the gate electrode; and a buffer pattern between each of the channel structures and each of the source/drain layers, the buffer pattern including a semi-metal, wherein each of the channel structures includes a first 2D material layer and a second 2D material layer stacked in the vertical direction, the first 2D material layer includes a semiconducting transition metal dichalcogenide (TMD), the semiconducting TMD containing a first transition metal and first chalcogen elements, the first chalcogen elements being bonded at a lower side of the first transition metal and being bonded at an upper side of the first transition metal, the second 2D material layer includes a second transition metal and a second chalcogen element, the second chalcogen element being bonded at a lower side of the second transition metal, and the second transition metal included in the second 2D material layer is bonded with an element included in the upper first gate insulation pattern are bonded by a covalent bond or an ionic bond.

BRIEF DESCRIPTION OF THE DRAWINGS

Features will be apparent to those of skill in the art by describing in detail exemplary embodiments with reference to the attached drawings in which.

DETAILED DESCRIPTION

Hereinafter, in the specification (and not necessarily in the claims), two directions substantially parallel to an upper surface of a substrate and intersecting each other may be defined as first and second directions D1 and D2, respectively, and a direction substantially perpendicular to the upper surface of the substrate may be defined as a third direction D3. In example embodiments, the first and second directions D1 and D2 may be substantially perpendicular to each other.

Figure 1:
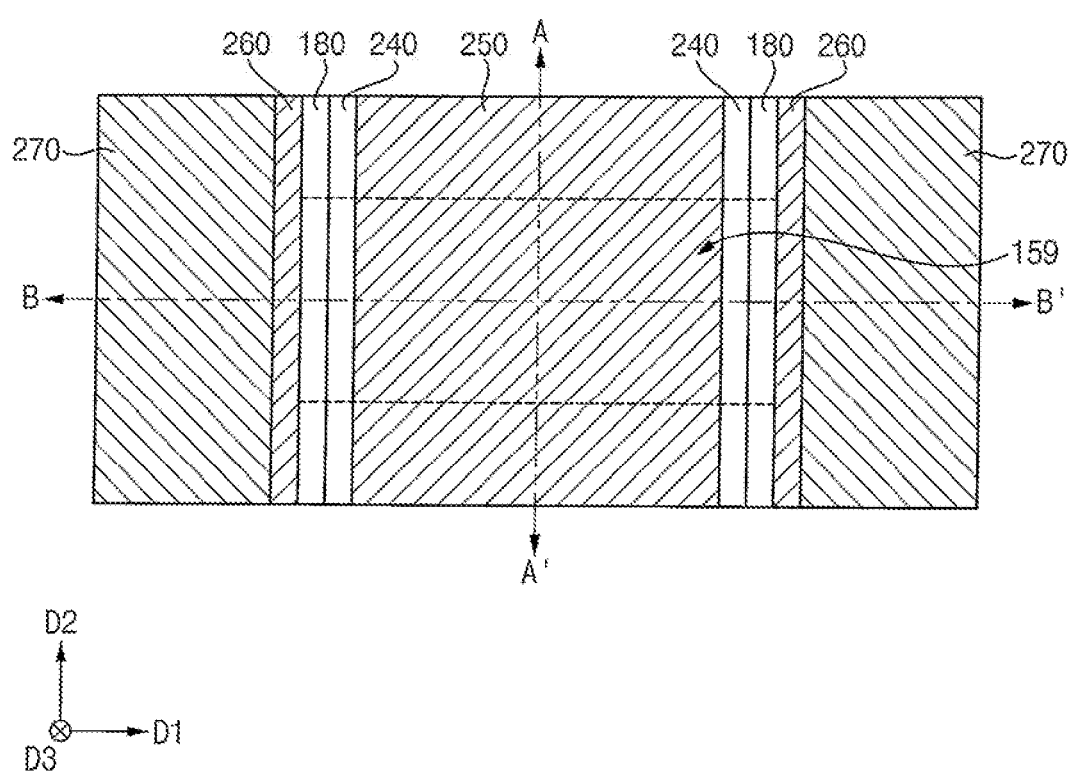
FIGS. 1 to 5 are a plan view and cross-sectional views of a semiconductor device in accordance with example embodiments.
Figure 2:
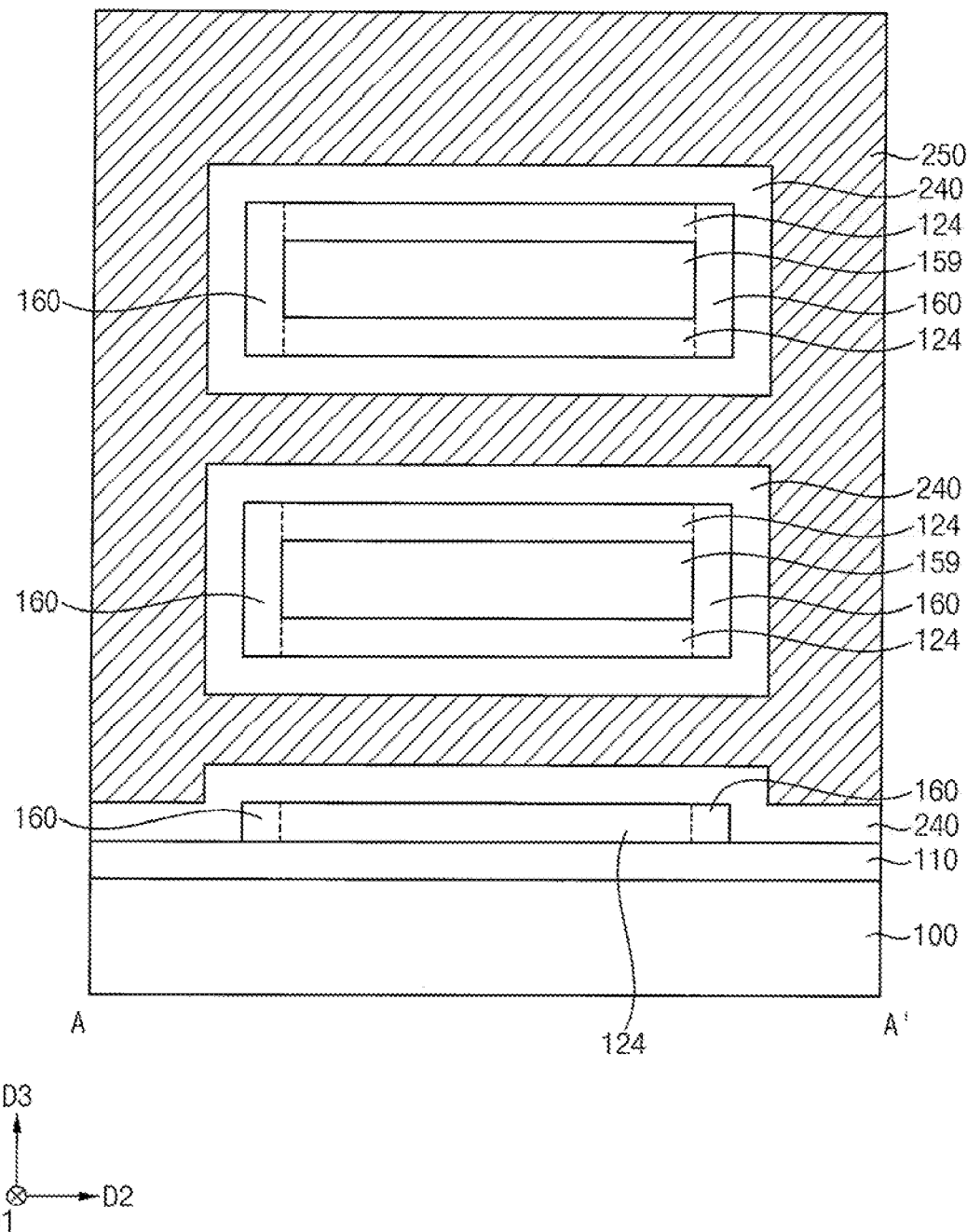
Figure 3:
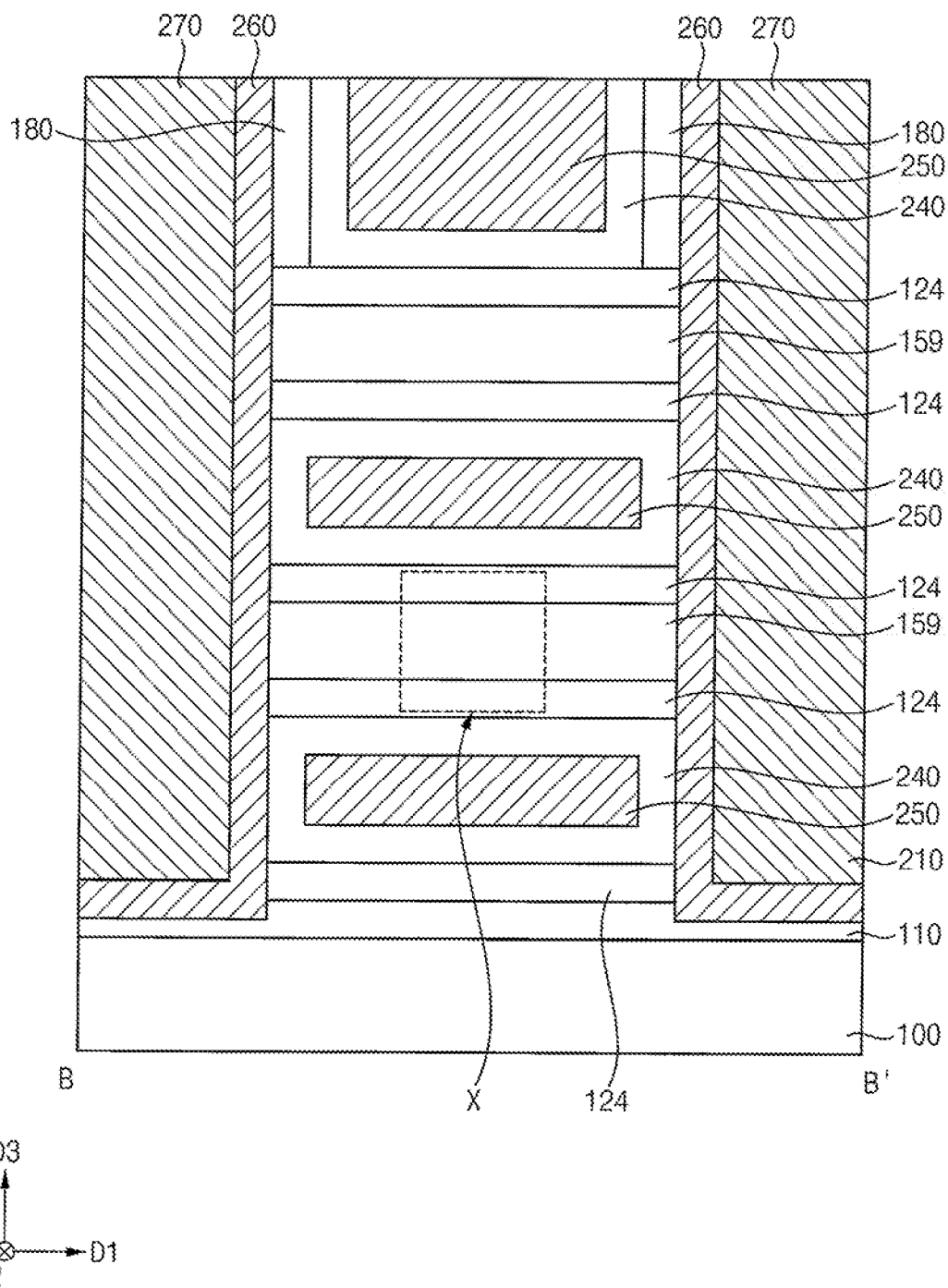
Figure 4:
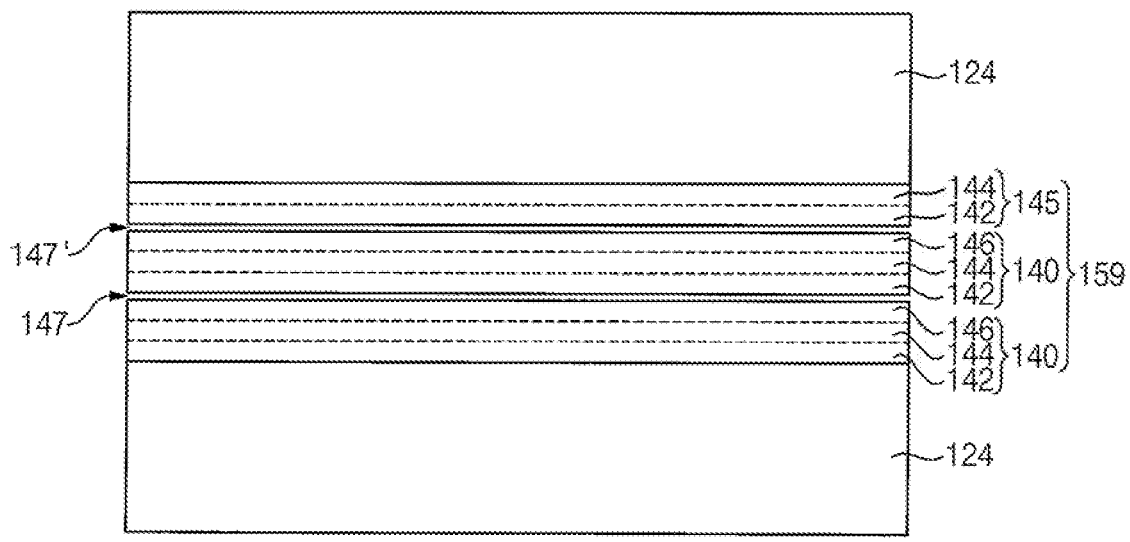
Figure 4:
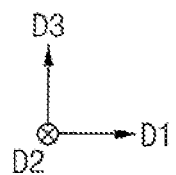
Figure 5:
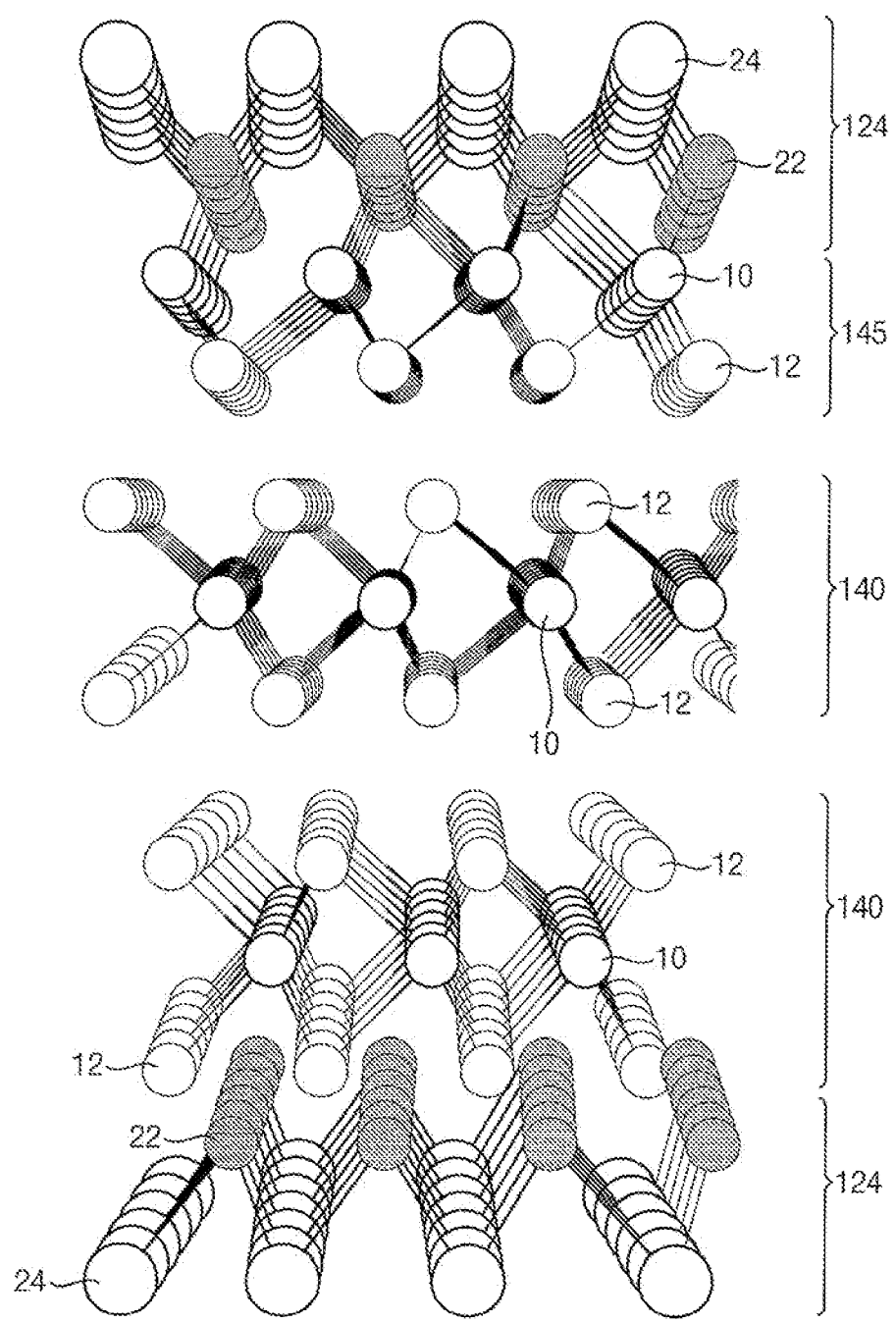

FIGS. 1 to 5 are a plan view and cross-sectional views of a semiconductor device in accordance with example embodiments. Specifically, FIG. 1 is the plan view, and FIGS. 2 to 5 are the cross-sectional views. FIG. 2 is a cross-sectional view taken along line A-A' of FIG. 1, FIG. 3 is a cross-sectional view taken along line B-B' of FIG. 1, FIG. 4 is an enlarged cross-sectional view of region X of FIG. 3, and FIG. 5 illustrates a bonding structure in the region X of FIG. 3.

Referring to FIGS. 1 to 5, the semiconductor device may include a gate electrode 250, a first gate insulation pattern 124 (including a lower first gate insulation pattern and an upper first gate insulation pattern), a second gate insulation pattern 240, a channel structure 159, a source/drain layer 270, a protection pattern 160, an etch stop layer 110, a spacer 180, and a buffer pattern 260. As used herein, the terms "first," "second," and the like are merely for identification and differentiation, and are not intended to imply or require sequential inclusion (e.g., a third element and a fourth element may be described without implying or requiring the presence of a first element or second element).

The substrate 100 may include a semiconductor material, e.g., silicon, germanium, silicon-germanium, or the like, or a III-V group compound, e.g., GaP, GaAs, GaSb, or the like. In an implementation, the substrate 100 may be a silicon-on-insulator (SOI) substrate or a germanium-on-insulator (GOI) substrate. As used herein, the term "or" is not an exclusive term, e.g., "A or B" would include A, B, or A and B.

The etch stop layer 110 may be on the substrate 100, and may include an insulating nitride, e.g., silicon nitride.

In an implementation, a plurality of channel structures 159 may be spaced apart from each other in the third direction D3, and each of the plurality of channel structures 159 may extend in the first direction D1 to or by a given or first length. In an implementation, as illustrated in FIGS. 2 and 3, two channel structures 159 may be spaced apart from each other in the third direction D3. In an implementation, more than two channel structures 159 may be spaced apart in the third direction D3.

In an implementation, a plurality of channel structures 159 may be spaced apart from each other in the first and second directions D1 and D2.

Each of the channel structures 159 may include first two-dimensional (2D) material layers 140 and a second 2D material layer 145 over or on an uppermost one (e.g., farthest from or distal to the substrate in the third direction D3) of the first 2D material layers 140. Neighboring ones of the first 2D material layers 140 in the third direction D3 and the uppermost one of the first 2D material layers 140 and the second 2D material layer 145 may be combined or attracted by a van der Waals (vdW) force, and may be spaced apart from each other by a vdW gap 147. In an implementation, as illustrated in FIG. 4, two first 2D material layers 140 may be stacked in the third direction D3. In an implementation, the channel structure 159 may include one first 2D material layer 145 or more than two 2D material layers 140.

In an implementation, the first 2D material layer 140 may include a transition metal dichalcogenide (TMD), which may include a transition metal and a chalcogen element. In an implementation, the first 2D material layer 140 may include a material that may be represented by a chemical formula $MX_2$ (in which M is a transition metal, and X is a chalcogen element). In an implementation, the first 2D material layer 140 may include a first transition metal 10 and first chalcogen elements 12, and the first chalcogen elements 12 may be bonded to lower and upper portions, respectively, of the first transition metal 10. In an implementation, in the first 2D material layer 140, the first transition metal 10 may be in a central region (in view of the vertical third direction D3), and the first chalcogen elements 12 may be on an upper side of the first transition metal 10 (e.g., a side of the first transition metal 10 distal to the substrate 100 in the third direction D3) and on a lower side of the first transition metal 10 (e.g., a side of the first transition metal 10 proximate to the substrate 100 in the third direction D3). In an implementation, a layer of the first transition metal 10 may be sandwiched between two layers of the first chalcogen elements 12 in the third direction D3. In an implementation, in the first 2D material layer 140, the first chalcogen elements 12 may be concentrated at an upper portion thereof and at a lower portion thereof, and the first transition metal 10 may be concentrated at a central portion thereof between the first chalcogen elements 12 (e.g., in the third direction D3).

In an implementation, the first 2D material layer 140 may include a lower chalcogen layer 142 including the first chalcogen element 12, a first transition metal layer 144 including the first transition metal 10, and an upper chalcogen layer 146 including the first chalcogen element 12 (e.g., sequentially stacked in the third direction D3).

In an implementation, the transition metal may include, e.g., molybdenum (Mo), tungsten (W), rhenium (Re), technetium (Tc), niobium (Nb), tantalum (Ta), hafnium (Hf), zirconium (Zr), osmium (Os), ruthenium (Ru), iridium (Ir), rhodium (Rh), platinum (Pt), palladium (Pd), yttrium (Y), lanthanum (La), lutetium (Lu), scandium (Sc), titanium (Ti), vanadium (V), chrome (Cr), manganese (Mn), iron (Fe), cobalt (Co), nickel (Ni), or the like. In an implementation, the chalcogen element may include, e.g., sulfur (S), selenium (Se), tellurium (Te), or the like.

In an implementation, the first 2D material layer 140 may include, e.g., molybdenum disulfide ($MoS_2$), molybdenum diselenide ($MoSe_2$), molybdenum ditelluride ($MoTe_2$), tungsten disulfide ($WS_2$), tungsten diselenide ($WSe_2$), tungsten ditelluride ($WTe_2$), or the like.

In an implementation, the second 2D material layer 145 may include a material that may be formed by removing the first chalcogen element 12 bonded to the upper portion or upper side of the first transition metal 10 from the TMD. In an implementation, the second 2D material layer 145 may not include the upper chalcogen layer 146, unlike the first 2D material layer 140, and may only include the lower chalcogen layer 142 and the first transition metal layer 144 stacked in the third direction D3.

The first gate insulation pattern 124 may contact (e.g., directly contact or be directly adjacent to) a lower (e.g., substrate 100-facing) surface of the channel structure 159 and may contact (e.g., directly contact or be directly adjacent to) an upper surface (e.g., surface facing away from the substrate 100) of the channel structure 159.

In an implementation, the first gate insulation pattern 124 may include, e.g., silicon oxide. In an implementation, the first gate insulation pattern 124 may include a metal oxide, e.g., hafnium oxide, aluminum oxide, or the like. In an implementation, the first gate insulation pattern 124 may include a central element 22 and oxygen (O) that is bonded to the central element 22 by, e.g., a covalent bond or an ionic bond.

In an implementation, the central element 22 in one of the first gate insulation patterns 124, which may contact (e.g., directly contact or be directly adjacent to) the upper surface of the channel structure 159, and the first transition metal 10 included in the second 2D material layer 145 of the channel structure 159 may be bonded with each other by a covalent bond. In an implementation, adhesion between the channel structure 159 and the first gate insulation pattern 124 may increase.

The second 2D material layer 145 and the central element 22 of the first gate insulation pattern 124, which may contact or be directly adjacent to the second 2D material layer 145, may form a Janus 2D TMD. In an implementation, the second 2D material layer 145 and a portion of the first gate insulation pattern 124 may include a material represented by, e.g., a chemical formula MXY (in which M may be a transition metal, X may be a chalcogen element, and Y may be silicon or a metal that is different from X).

In an implementation, the second 2D material layer 145 at an uppermost level in the channel structure 159 and contacting the first gate insulation pattern 124 may not serve as a channel, may serve as a contact layer or a buffer layer between the first gate insulation pattern 124 and a channel, and only the first 2D material layers 140 in the channel structure 159 may be referred to as the channel.

The first 2D material layer 140 included in the channel structure 159 may include a TMD, and thus may not be (e.g., covalently) bonded with one of the first gate insulation patterns 124, which may contact a lower surface of the channel structure 159.

The protection pattern 160 may cover opposite ends (in the second direction D2) of the channel structure 159, and may also cover opposite ends (in the second direction D2) of the first gate insulation patterns 124 (that are on lower and upper surfaces, respectively, of the channel structure 159). The protection pattern 160 may include, e.g., silicon oxide or a metal oxide. In an implementation, the protection pattern 160 may be merged to the first gate insulation pattern 124 (e.g., as a monolithic, integrated structure).

The gate electrode 250 may extend (e.g., lengthwise) in the second direction D2 on the etch stop layer 110, and may cover portions, e.g., central portions (in the first direction D1) of the channel structures 159 spaced apart from each other in the second direction D2, the first gate insulation patterns 124 contacting lower and upper surfaces of the channel structures 159, and the protection patterns 160. In an implementation, a plurality of gate electrodes 250 may be spaced apart from each other in the first direction D1, and FIGS. 1 to 3 show one gate electrode 250.

The gate electrode 250 may include, e.g., a metal, a metal nitride, a metal silicide, or the like.

The second gate insulation pattern 240 may cover a sidewall and a lower surface of a portion of the gate electrode 250 on the uppermost one of the first gate insulation patterns 124, and lower and upper surfaces and a sidewall of a portion of the gate electrode 250 between lower ones of the first gate insulation patterns 124. The second gate insulation pattern 240 may include a metal oxide, e.g., hafnium oxide, aluminum oxide, or the like.

The spacer 180 may cover an outer sidewall of a portion of the second gate insulation pattern 240, which may cover the sidewall of the portion of the gate electrode 250 on the uppermost one of the first gate insulation patterns 124. The spacer 180 may include an insulating nitride, e.g., silicon nitride.

In an implementation, a structure including the portion of the gate electrode 250 on the uppermost one of the first gate insulation patterns 124, the portion of the second gate insulation pattern 240 covering the portion of the gate electrode 250, and the spacers 180 on opposite outer sidewalls (in the first direction D1) of the portion of the second gate insulation pattern 240, may have a (e.g., total) width in the first direction D1, which may be substantially equal to an extension length (in the first direction D1) of the channel structure 159 or the first gate insulation pattern 124.

The gate electrode 250 and the first and second gate insulation patterns 124 and 240 may collectively form a gate structure.

The buffer pattern 260 may be on opposite sidewalls (in the first direction D1) of a second stack structure, which may include the channel structure 159, the first and second gate insulation patterns 124 and 240, the gate electrode 250 and the spacer 180, and an upper surface of the etch stop layer 110. In an implementation, the buffer pattern 260 may include a semi-metal, e.g., bismuth (Bi), antimony (Sb), arsenic (As), or the like.

The source/drain layer 270 may be at each of opposite sides (in the first direction D1) of the gate electrode 250, and may contact the buffer pattern 260. The source/drain layer 270 may include, e.g., a metal, a metal nitride, a metal silicide, or the like.

The buffer pattern 260 including a semi-metal may be between the source/drain layer 270 including, e.g., a metal, and the channel structure 159 including a semiconducting 2D material, so that a contact resistance between the source/drain layer 270 and the channel structure 159 may decrease.

The semiconductor device may include the channel structures 159 spaced apart from each other in the third direction D3 on the substrate 100, and thus may be a multi-bridge channel field effect transistor (MBCFET). Each of the channel structures 159 may include a semiconducting 2D material, e.g., TMD.

In an implementation, the channel structure 159 may include at least one first 2D material layer 140 and the second 2D material layer 145 on the at least one first 2D material layer 140. The first transition metal 10 included in the second 2D material layer 145 and the central element 22 included in the first gate insulation pattern 124 may be bonded with each other by a covalent bond, which may form a Janus TMD. In an implementation, the adhesion between the channel structure 159 and the first gate insulation pattern 124 may increase.

The vdW gap 147 may be between the first 2D material layer 140 and the second 2D material layer 145, or between neighboring ones of the first 2D material layers 140 spaced apart from each other in the third direction D3, and thus charge trapping may not occur therebetween. In an implementation, the semiconductor device including the channel structure 159 may have enhanced electrical characteristics.

Figure 6:
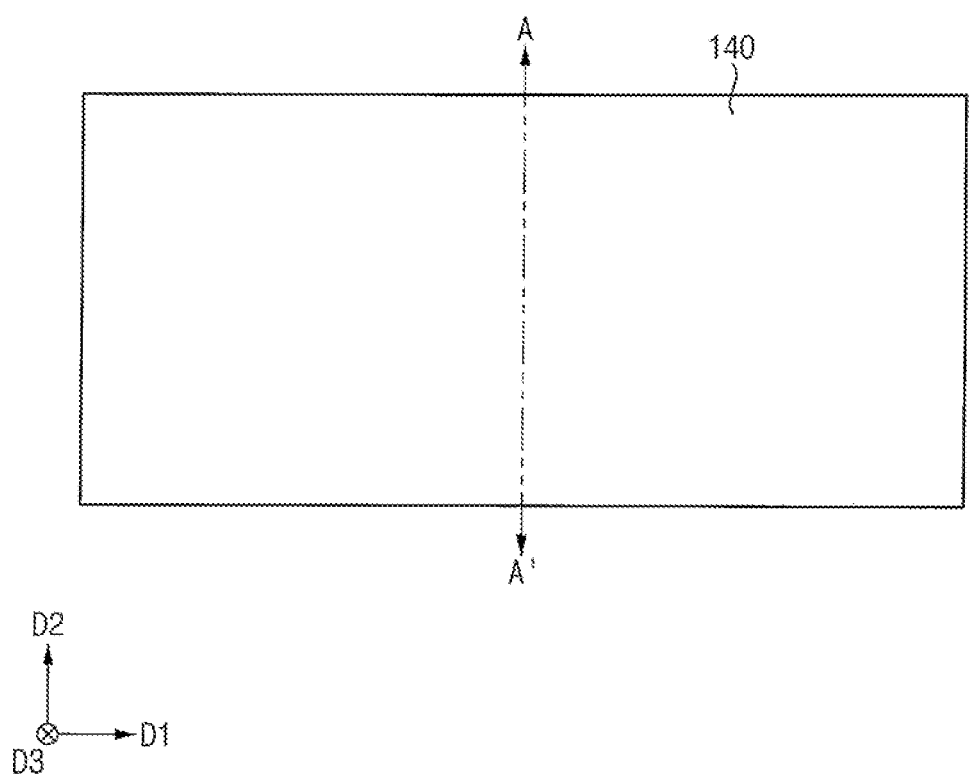
FIGS. 6 to 17 are plan views and cross-sectional views of stages in a method of manufacturing a semiconductor device in accordance with example embodiments.
Figure 8:
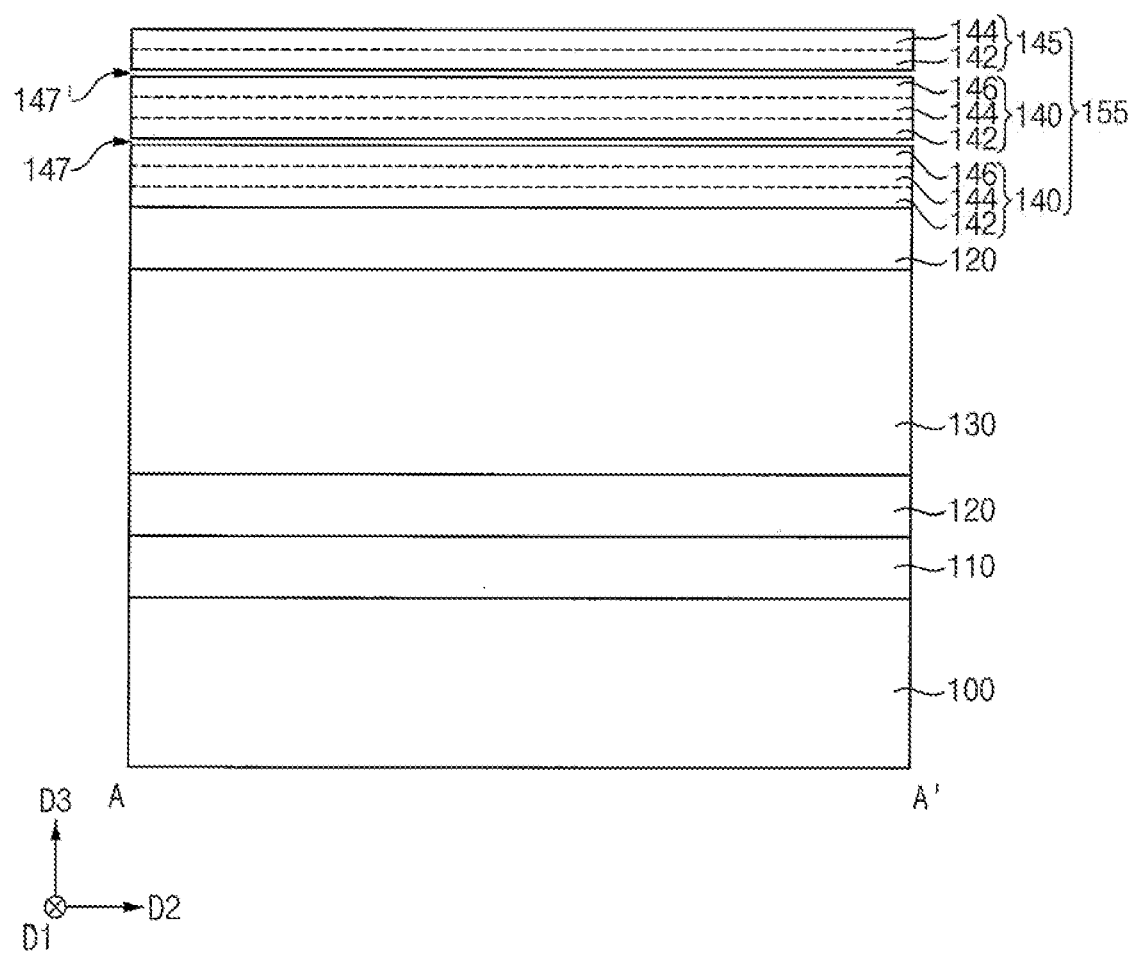
Figure 9:
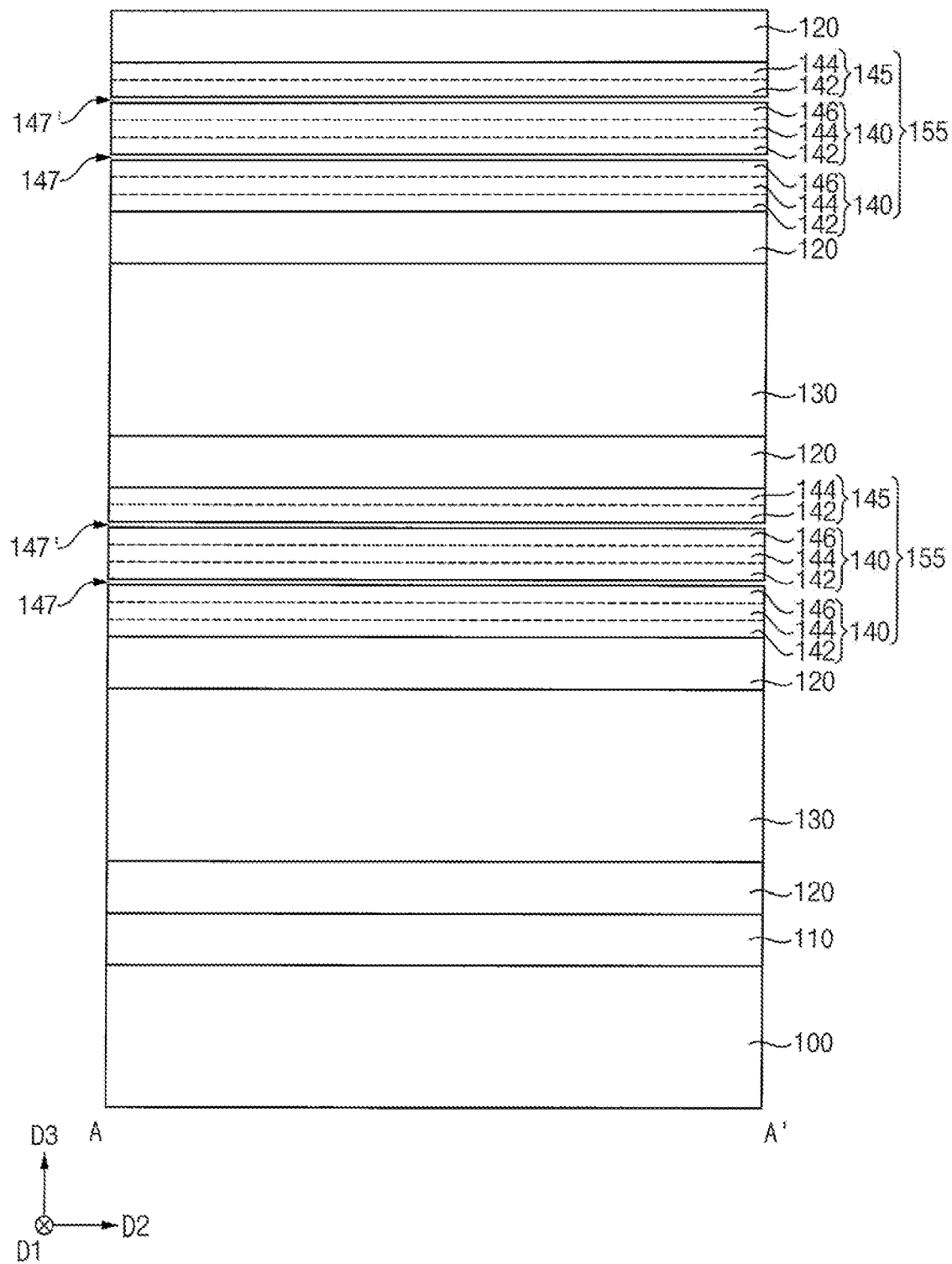
Figure 10:
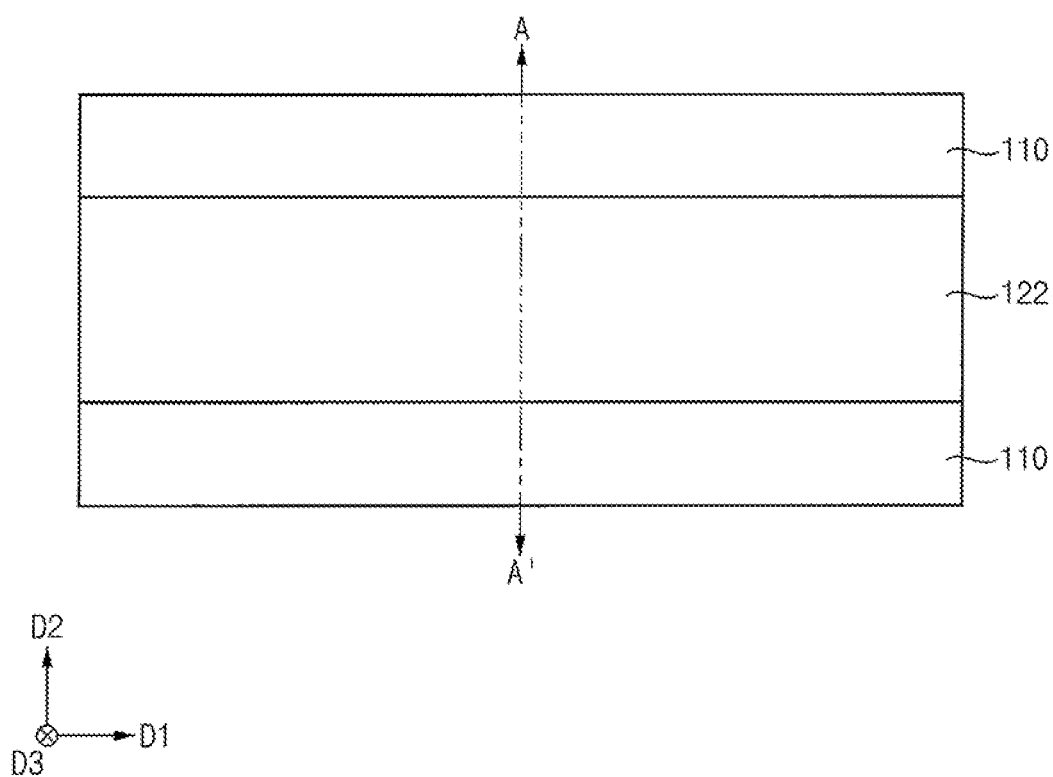
Figure 11:
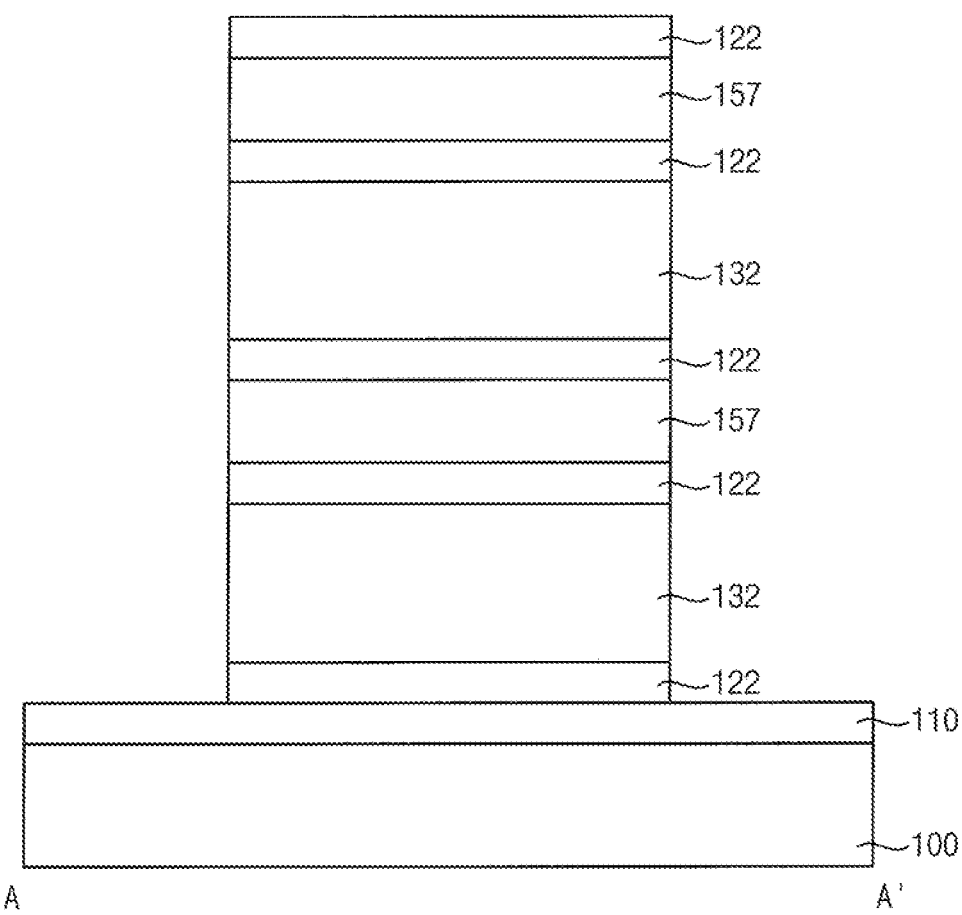
Figure 11:
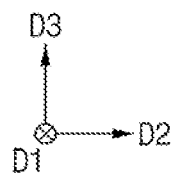
Figure 12:
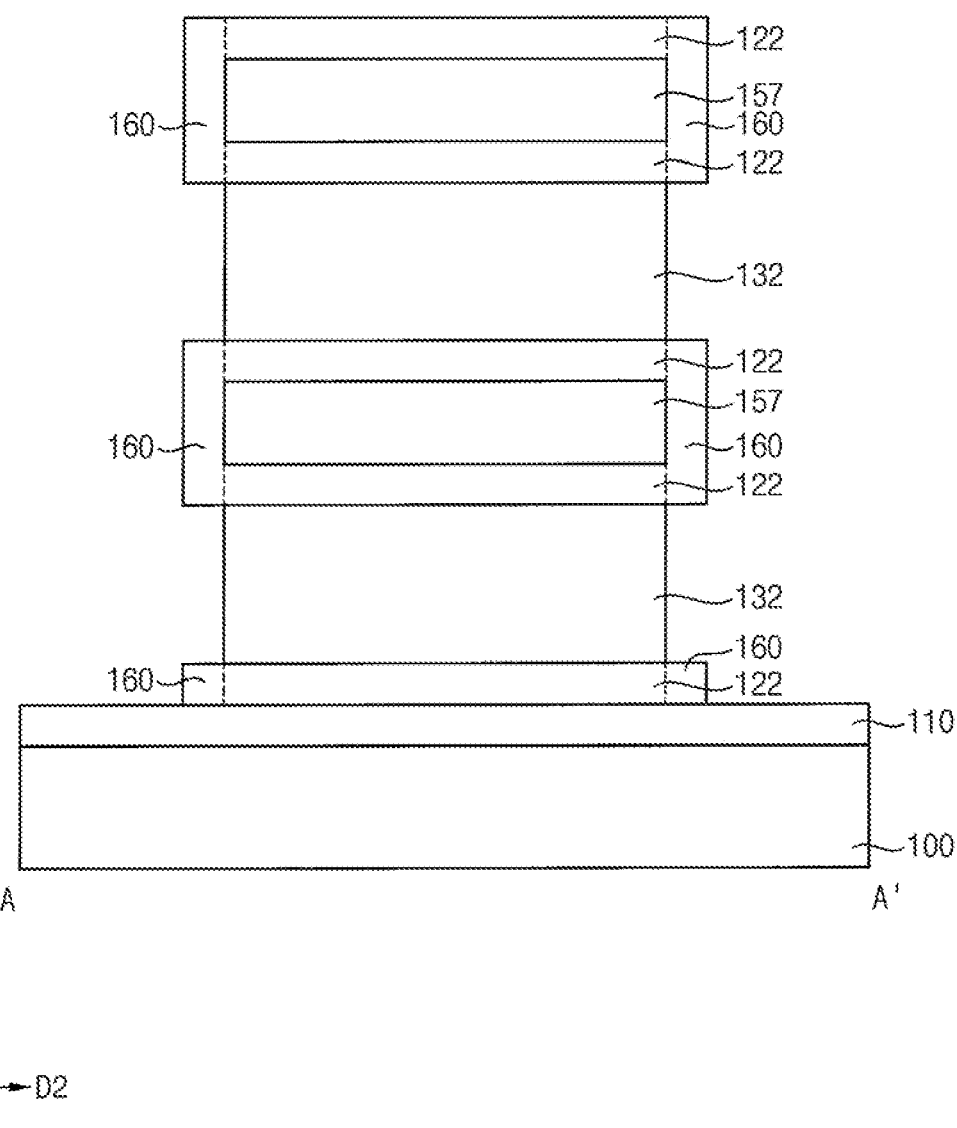
Figure 13:
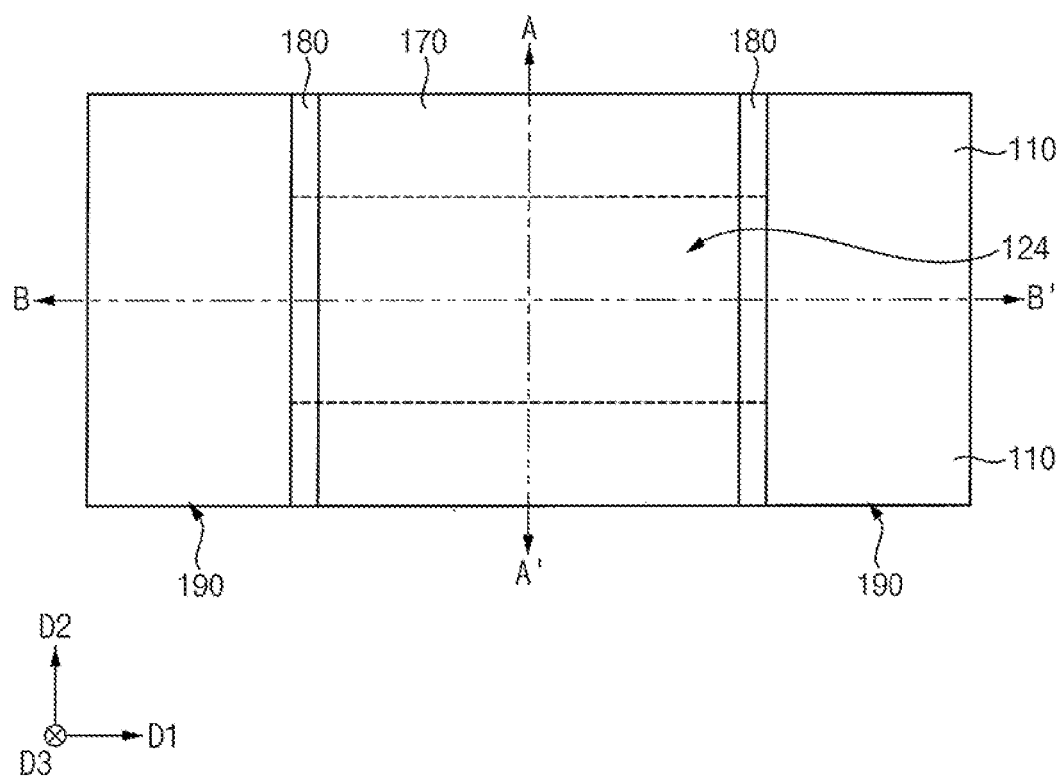

FIGS. 6 to 17 are plan views and cross-sectional views of stages in a method of manufacturing a semiconductor device in accordance with example embodiments. FIGS. 6, 10 and 13 are the plan views, and FIGS. 7-9, 11-12 and 14-17 are the cross-sectional views.

Figure 14:
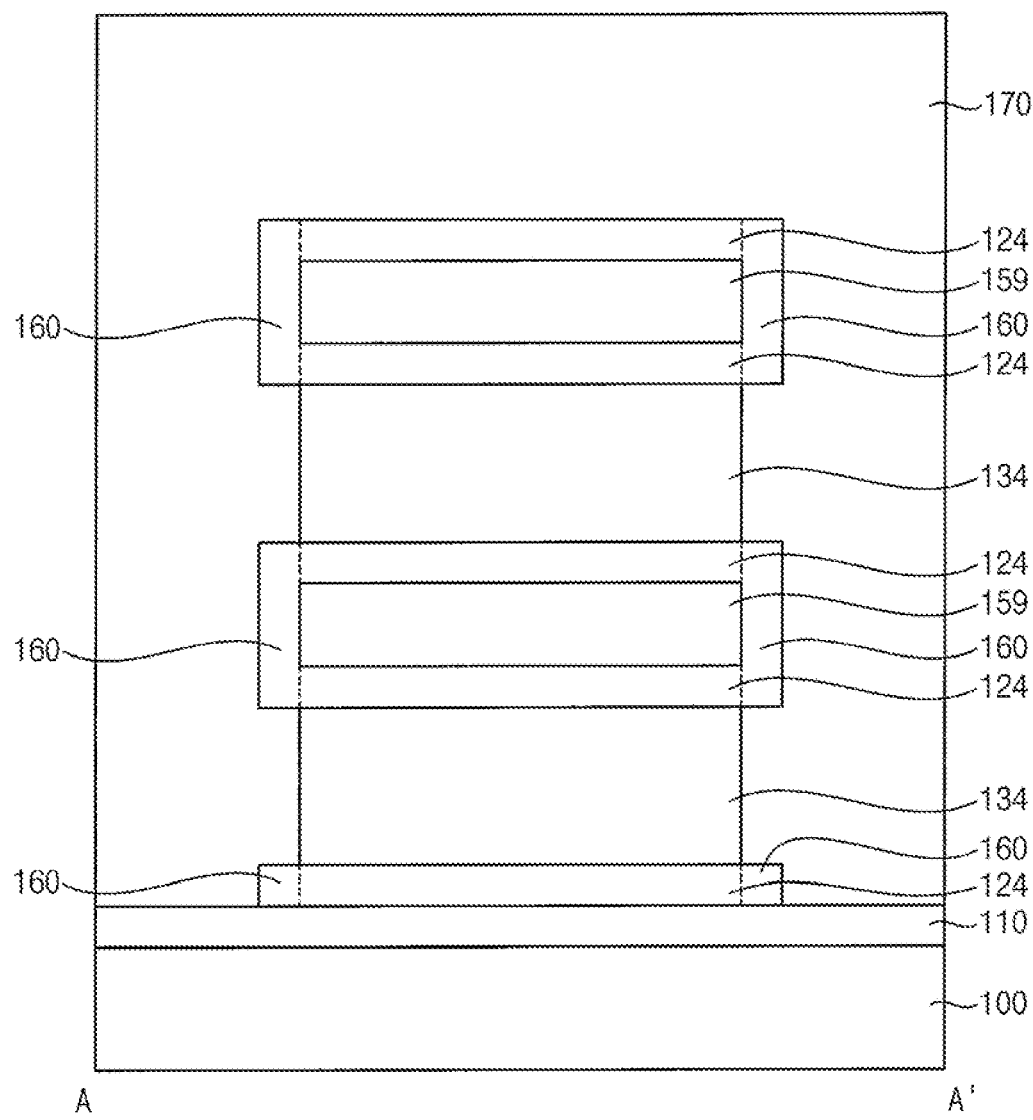
Figure 15:
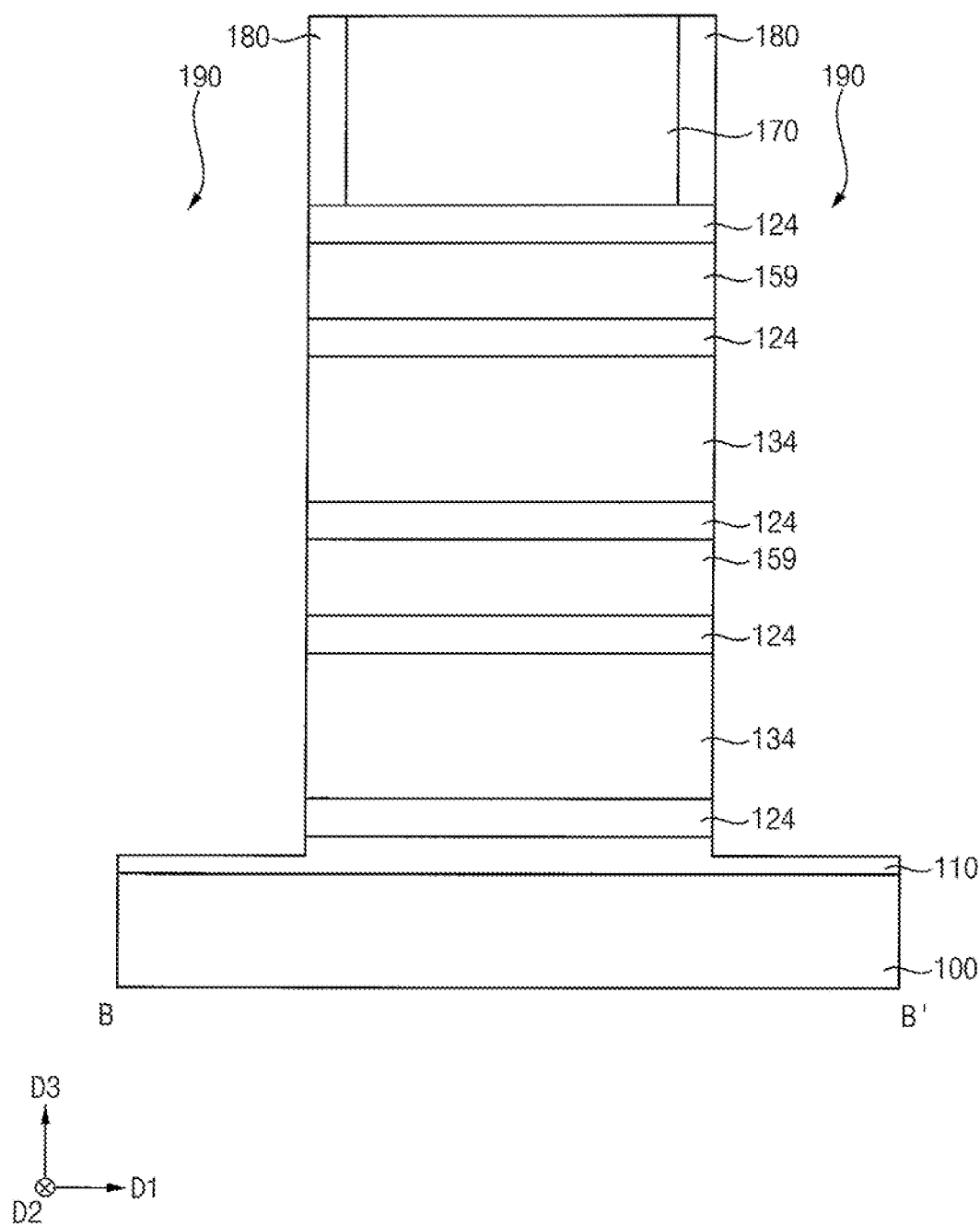
Figure 16:
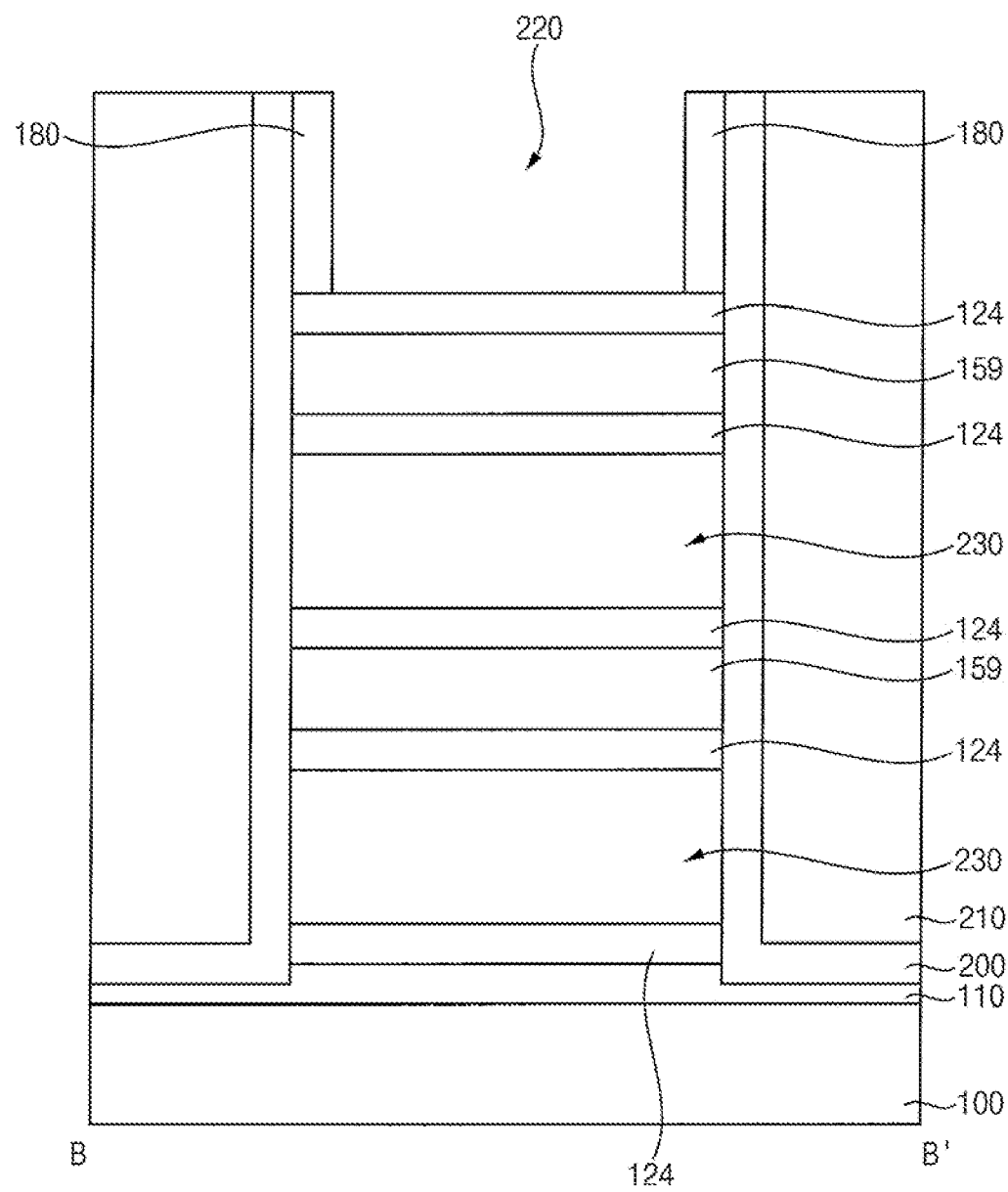
Figure 17:
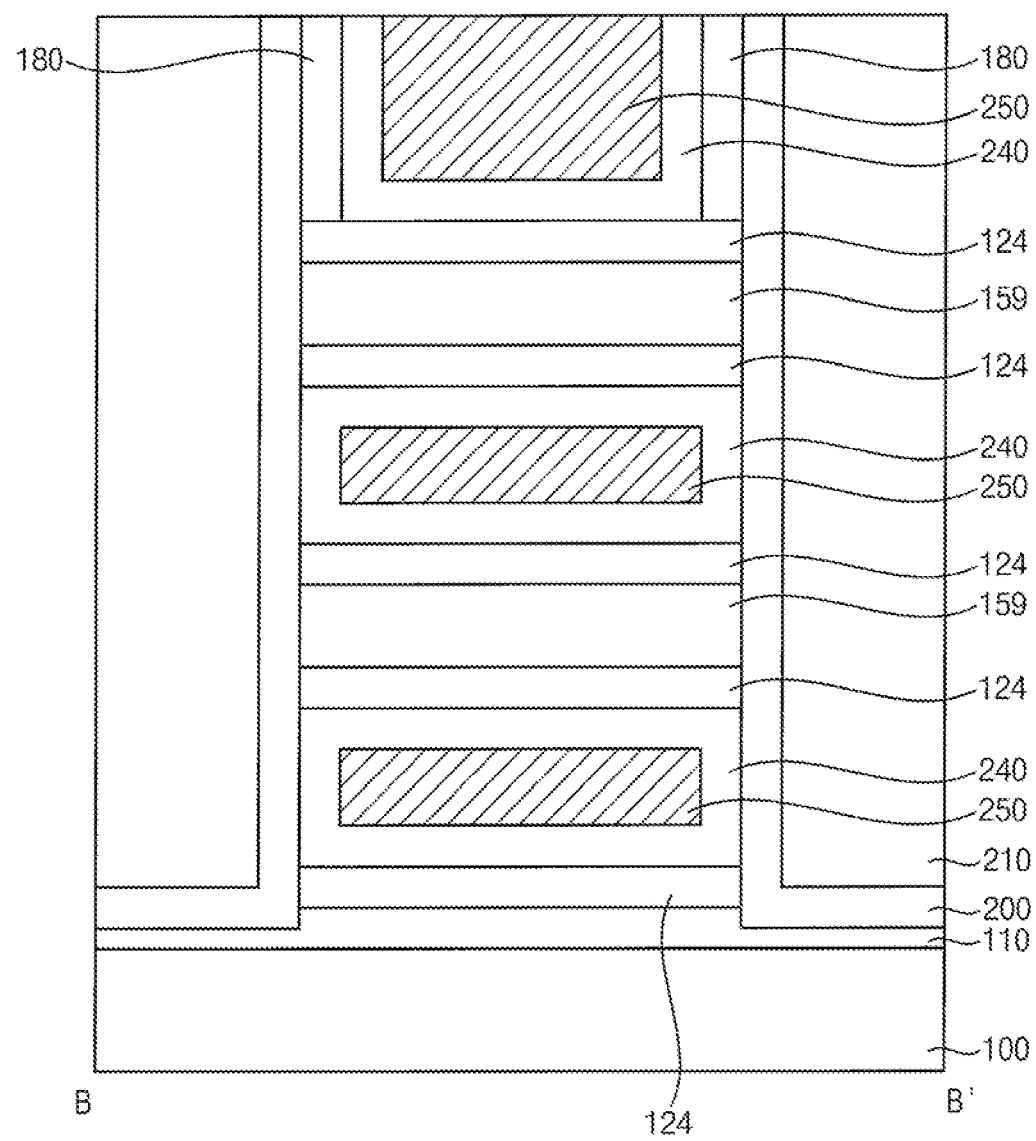

FIGS. 7-9, 11-12 and 14 are cross-sectional views taken along lines A-A' of corresponding plan views, respectively, FIGS. 15-17 are cross-sectional views taken along lines B-B' of corresponding plan views, respectively.

Figure 7:
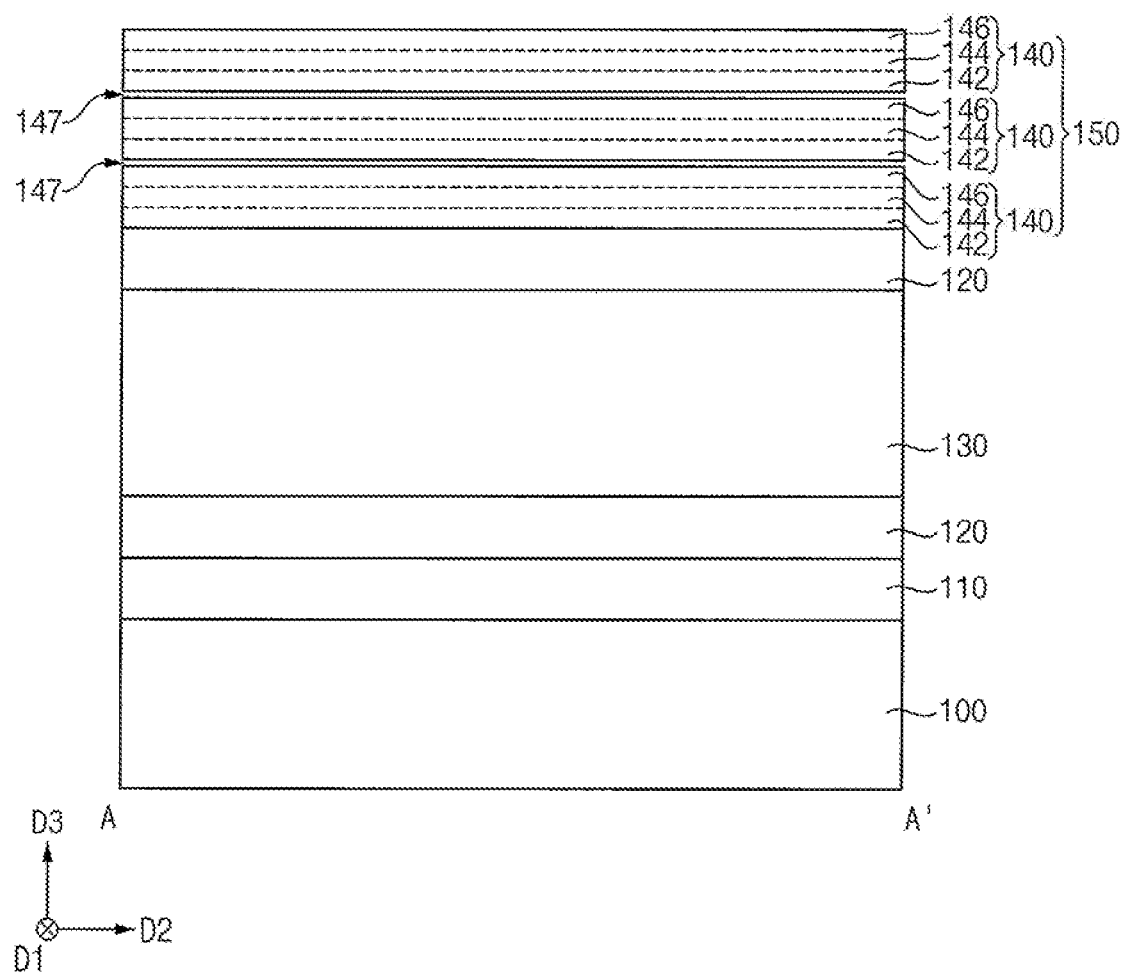

Referring FIGS. 6 and 7, an etch stop layer 110, a first gate insulation layer 120, a first sacrificial layer 130 and a first gate insulation layer 120 may be sequentially formed on a substrate 100, and a preliminary channel layer 150 may be formed on the first gate insulation layer 120.

In an implementation, the first gate insulation layer 120 may include, e.g., silicon oxide. In an implementation, the first gate insulation layer 120 may include a metal oxide, e.g., hafnium oxide, aluminum oxide, or the like. In an implementation, the first gate insulation layer 120 may include a central element 22 and oxygen (O) 24 that are bonded with each other by a covalent bond or an ionic bond (refer to the first gate insulation pattern 124 in FIG. 5).

The first sacrificial layer 130 may include a material having an etching selectivity with respect to the preliminary channel layer 150 and the first gate insulation layer 120, e.g., silicon-germanium (SiGe).

In an implementation, the preliminary channel layer 150 may be a first 2D material layer 140 including a semiconducting 2D material.

In an implementation, the first 2D material layer 140 may include a TMD. In an implementation, the first 2D material layer 140 may include a material that may be represented by a chemical formula $MX_2$ (in which M may be a transition metal, and X may be a chalcogen element), and may include, e.g., the first transition metal 10 and the first chalcogen elements 12 bonded to the lower and upper portions or sides of the first transition metal 10 (as described above with respect to FIG. 5).

In an implementation, the first 2D material layer 140 may include a lower chalcogen layer 142 containing the first chalcogen element 12, a first transition metal layer 144 containing the first transition metal 10, and an upper chalcogen layer 146 containing the first chalcogen element 12.

In an implementation, the preliminary channel layer 150 may have a multi-layered structure including the first 2D material layers 140 stacked in the third direction D3. The first 2D material layers 140 may be bonded with each other by a vdW force, and may be spaced apart from each other by a vdW gap 147.

Referring to FIG. 8, the substrate 100 may be heated with, e.g., H plasma, F plasma, He$^+$ ions, laser, or the like, so that the first chalcogen element 12 included in the upper chalcogen layer 146 in an uppermost one of the first 2D material layers 140 included in the preliminary channel layer 150 may be removed.

In an implementation, the first 2D material layers 140 may include, e.g., molybdenum disulfide ($MoS_2$), and the substrate 100 may be heated to a temperature of, e.g., about 350° C. to about 450° C. In an implementation, the first 2D material layers 140 may include, e.g., molybdenum diselenide ($MoSe_2$), and the substrate 100 may be heated to a temperature of, e.g., about 750° C. to about 850° C.

In an implementation, a laser may be provided onto the substrate 100, and $H_2$, $H_2S$, $H_2Se$, or $PH_3$ may be also used.

By the above processes, the first chalcogen element 12 at an upper portion or side of the TMD included in the uppermost one of the first 2D material layers 140 may be removed to form a second 2D material layer 145. In an implementation, the second 2D material layer 145 may include only the lower chalcogen layer 142 and the first transition metal layer 144 stacked in the third direction D3. Dangling bonds may be formed at an upper portion or side of the second 2D material layer 145.

The first 2D material layers 140 and the second 2D material layer 145 may collectively form a channel layer 155.

Referring to FIG. 9, the first gate insulation layer 120 may be formed on the channel layer 155 again.

In an implementation, the first gate insulation layer 120 may be formed by, e.g., an atomic layer deposition (ALD) process or a chemical vapor deposition (CVD) process.

The bonding between the first transition metal 10 and the first chalcogen element 12 in the first 2D material layer 140 could be so strong so that the first gate insulation layer 120 may not be easily formed on the first 2D material layer 140 by an ALD process or a CVD process. The first gate insulation layer 120 could be formed on the first 2D material layer 140 by a physical vapor deposition (PVD) process, and the first gate insulation layer 120 may not have a desired thin thickness.

In an implementation, the channel layer 155 may include the second 2D material layer 145 at an upper portion thereof, and the second 2D material layer 145 may include dangling bonds, which may be formed by removing the first chalcogen element 12 bonded to the first transition metal 10. In an implementation, the central element 22 included in the first gate insulation layer 120, e.g., silicon or metal, may be bonded with the first transition metal 10 included in the second 2D material layer 145 by a covalent bond, so that the first gate insulation layer 120 may be easily formed on the channel layer 155 by an ALD process or a CVD process. In an implementation, the first transition metal 10 included in the second 2D material layer 145 and the central element 22 in the first gate insulation layer 120 on the second 2D material layer 145 may be bonded with each other by a covalent bond.

The first sacrificial layer 130, the first gate insulation layer 120, the channel layer 155 and the first gate insulation layer 120 may be sequentially formed on the first gate insulation layer 120, and the channel layer 155 may be formed by processes substantially the same as or similar to those illustrated with reference to FIG. 8.

In an implementation, the first sacrificial layer 130 and the channel layer 155 may be alternately and repeatedly stacked between the first gate insulation layers 120, and FIG. 9 shows two first sacrificial layers 130 and two channel layers 155.

Referring to FIGS. 10 and 11, the first gate insulation layer 120, the first sacrificial layer 130 and the channel layer 155 may be patterned to form a first gate insulation line 122, a sacrificial line 132 and a channel line 157, respectively, which may collectively form a line structure extending (e.g., lengthwise) in the first direction D1.

In an implementation, a plurality of line structures may be formed to be spaced apart from each other in the second direction D2, and FIGS. 10 and 11 show one line structure.

Referring to FIG. 12, a protection pattern 160 may be formed by a selective deposition process to cover opposite sidewalls in the second direction D2 of the channel line 157.

In an implementation, the protection pattern 160 may include silicon oxide or a metal oxide, and may also be formed on each of opposite ends in the second direction D2 of each of the first gate insulation lines 122.

Referring to FIGS. 13 to 15, a dummy gate electrode 170 may be formed on the etch stop layer 110 to cover the line structure and the protection pattern 160 and extend in the second direction D2, a spacer layer may be formed on the line structure and the etch stop layer 110 to cover an upper surface and a sidewall of the dummy gate electrode 170, and the spacer layer may be anisotropically etched to form a spacer 180 on each of opposite sidewalls in the first direction D1 of the dummy gate electrode 170.

In an implementation, a plurality of dummy gate electrodes 170 may be spaced apart from each other in the first direction D1, and FIGS. 13 to 15 show one dummy gate electrode 170.

The dummy gate electrode 170 may include, e.g., polysilicon.

A dry etching process may be performed using the dummy gate electrode 170 and the spacer 180 as an etching mask to pattern the line structure.

In an implementation, the first gate insulation line 122, the sacrificial line 132 and the channel line 157 may be divided into first gate insulation patterns 124, sacrificial patterns 134 and channel structures 159, respectively, which may form a first stack structure together with the dummy gate electrode 170 and the spacer 180. In an implementation, a plurality of first stack structures may be spaced apart from each other in the first and second directions D1 and D2, and FIGS. 13 to 15 show one first stack structure.

A first opening 190 may be formed at each of opposite sides in the first direction D1 of the first stack structure.

Referring to FIG. 16, a sacrificial spacer layer 200 may be formed on the etch stop layer 110 to cover the first stack structure, and a second sacrificial layer 210 may be formed on the sacrificial spacer layer 200.

The sacrificial spacer layer 200 may include an insulating nitride, e.g., silicon nitride, and the second sacrificial layer 210 may include an oxide, e.g., silicon oxide.

A planarization process may be performed until an upper surface of the dummy gate electrode 170 is exposed to remove upper portions of the second sacrificial layer 210 and the sacrificial spacer layer 200, and the dummy gate electrode 170 and the sacrificial pattern 134 may be removed by, e.g., a wet etching process, to form second and third openings 220 and 230, respectively.

As the second and third openings 220 and 230 are formed, an inner sidewall of the spacer 180, a surface of the first gate insulation pattern 124 and an inner sidewall of the sacrificial spacer layer 200 may be exposed.

The planarization process may include, e.g., a chemical mechanical polishing (CMP) process or an etch back process.

Referring to FIG. 17, a second gate insulation layer may be formed on the inner sidewall of the spacer 180, the surface of the first gate insulation pattern 124 and the inner sidewall of the sacrificial spacer layer 200 exposed by the second and third openings 220 and 230, a gate electrode layer may be formed to fill remaining portions of the second and third openings 220 and 230, and the gate electrode layer and the second gate insulation layer may be planarized until an upper surface of the second sacrificial layer 210 is exposed.

In an implementation, a second gate insulation pattern 240 may be formed on the inner sidewall of the spacer 180, the surface of the first gate insulation pattern 124 and the inner sidewall of the sacrificial spacer layer 200 exposed by the second and third openings 220 and 230, and a gate electrode 250 may be formed in the remaining portions of the second and third openings 220 and 230.

Hereinafter, the channel structure 159, the first and second gate insulation patterns 124 and 240, the gate electrode 250 and the spacer 180 altogether may be referred to as a second stack structure.

Referring to FIGS. 1 to 5 again, the second sacrificial layer 210 and the sacrificial spacer layer 200 may be removed by, e.g., a wet etching process, to form a fourth opening exposing opposite sidewalls in the first direction D1 of the second stack structure and an upper surface of the etch stop layer 110.

A buffer layer may be formed to cover an upper surface and a sidewall of the second stack structure, a source/drain layer may be formed on the buffer layer, and the source/drain layer and the buffer layer may be planarized until an upper surface of the dummy gate electrode 170 is exposed.

In an implementation, a buffer pattern 260 may be formed to cover each of opposite sidewalls in the first direction D1 and the upper surface of the etch stop layer 110, and a source/drain layer 270 may be formed on the buffer pattern 260 to fill a remaining portion of the fourth opening.

An insulating interlayer may be formed on the second stack structure, the buffer pattern 260 and the source/drain layer 270, and contact plugs, vias and wirings may be formed to be electrically connected to the source/drain layer 270.

By the above processes, the fabrication of the semiconductor device may be completed.

In an implementation, as described above, the first chalcogen element 12 at the upper portion or side of the first 2D material layer 140 in the uppermost one of the first 2D material layers 140 included in the preliminary channel layer 150 may be removed to form the channel layer 155 including the second 2D material layer 145 having dangling bonds, and thus the first gate insulation layer 120 may be easily formed by an ALD process or a CVD process.

In an implementation, the first gate insulation layer 120 may have a relatively thin thickness when compared to that formed by a PVD process, and a surface scattering may decrease. Accordingly, the semiconductor device may have increased mobility and enhanced reliability. Additionally, the first gate insulation layer 120 and the channel layer 155 may be bonded with each other by a covalent bond, and the adhesion between the first gate insulation layer 120 and the channel layer 155 may increase.

Figure 18:
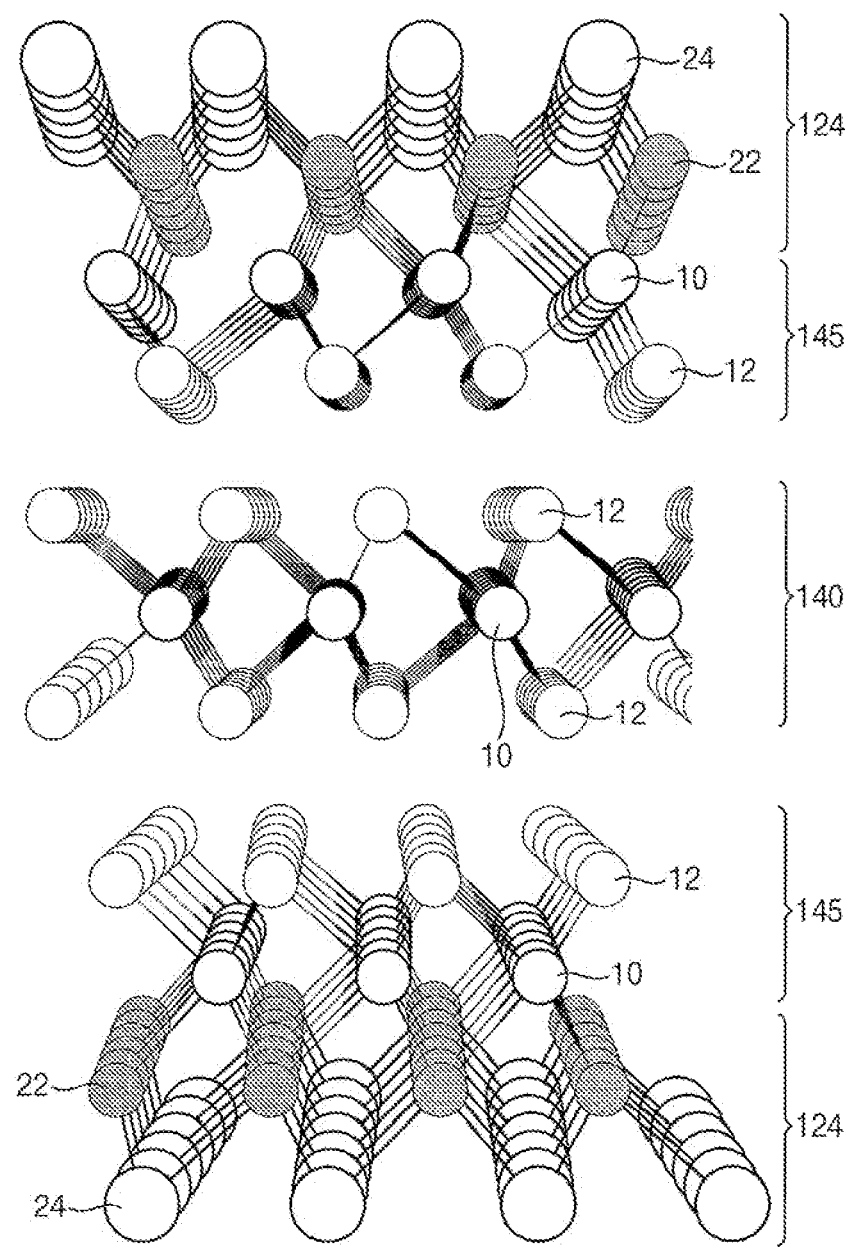
FIGS. 18 and 19 illustrate the bonding structure between the channel structure and the first gate insulation pattern in the semiconductor devices in accordance with example embodiments.
Figure 19:
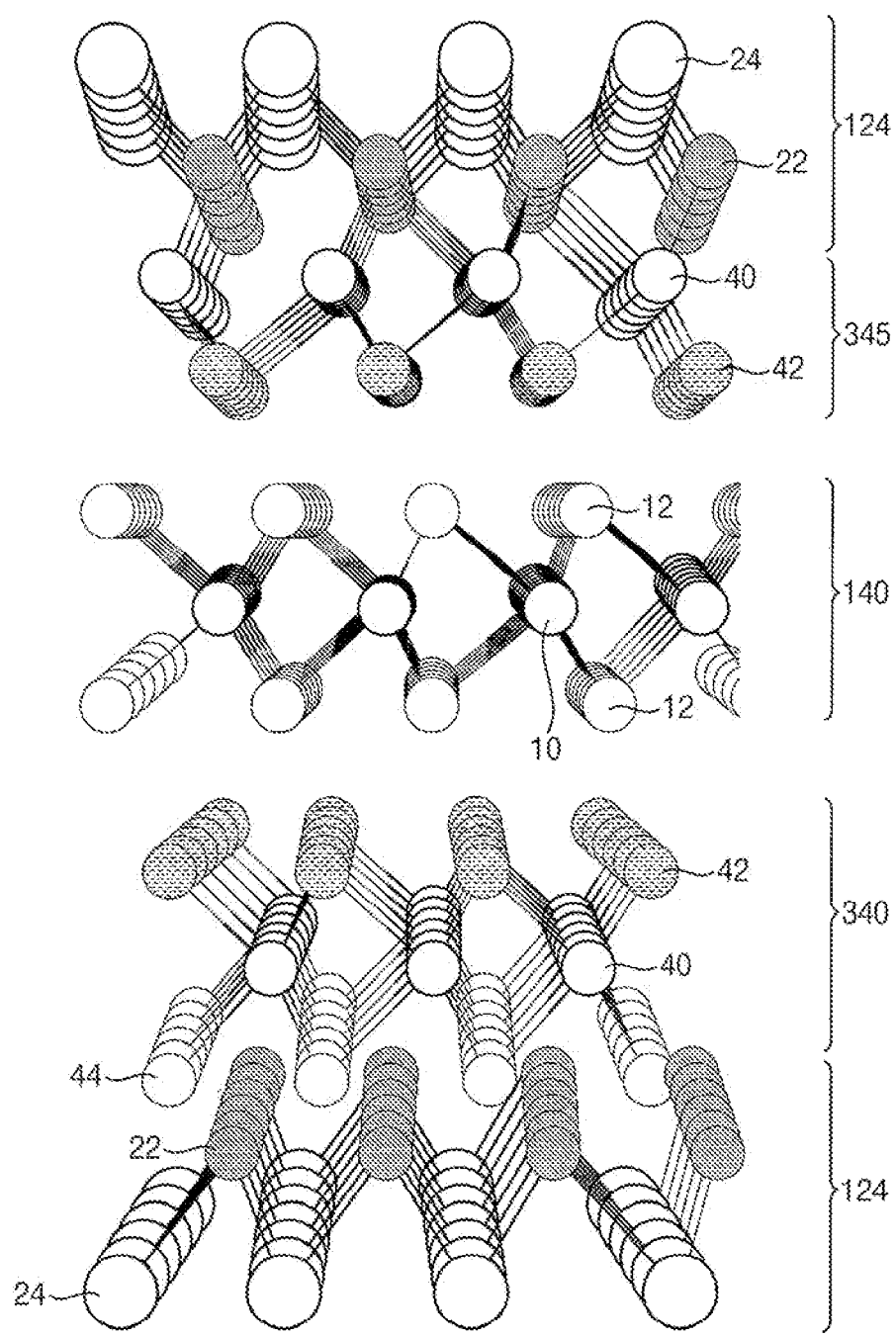

FIGS. 18 and 19 illustrate the bonding structure between the channel structure and the first gate insulation pattern in the semiconductor devices in accordance with example embodiments.

Referring to FIG. 18, the channel structure 159 may include the first 2D material layer 140 and the second 2D material layers 145 under and over, respectively, the first 2D material layer 140 (e.g., the first 2D material layer 140 may be sandwiched between the second 2D material layers 145). In an implementation, the adhesion between the channel structure 159 and the first gate insulation pattern 124, which may contact a lower surface of the channel structure 159, as well as the adhesion between the channel structure 159 and the first gate insulation pattern 124, which may contact the upper surface of the channel structure 159, may increase.

Only the first 2D material layer 140 in the channel structure 159 may serve as a channel, and the second 2D material layers 145 under and over, respectively, the first 2D material layer 140, may not serve as a channel.

Referring to FIG. 19, the channel structure 159 may include the first 2D material layer 140 and third and fourth 2D material layers 340 and 345 under and over, respectively, the first 2D material layer 140.

In an implementation, the third 2D material layer 340 may include a metallic TMD. In an implementation, the third 2D material layer 340 may include a second transition metal 40 and second and third chalcogen elements 42 and 44 bonded with upper and lower portions or sides, respectively, of the second transition metal 40. The second and third chalcogen elements may be the same or different from each other. In an implementation, the third 2D material layer 340 may include, e.g., $NbS_2$, $NbSe_2$, $NbTe_2$, $TaS_2$, $TaSe_2$, $TaTe_2$, or the like.

The third chalcogen element 44 may be removed from the third 2D material layer 340 to form dangling bonds, and the second transition metal 40 in the third 2D material layer 340 and the central element 22 included in the first gate insulation pattern 124 may be bonded with each other by a covalent bond.

In an implementation, the third 2D material layer 340 may include Janus 2D Mxene, which may be metallic.

In an implementation, the third 2D material layer 340 may include a material containing Mxene, which may include a carbide of TMD, a nitride of TMD, or a carbonitride of TMD, bonded with O, F, OH, or the like. In an implementation, the third 2D material layer 340 may include a material represented by a chemical formula MXT (in which M may be a transition metal, X may be C, N or CN, and T may be O, F or OH), e.g., $Ti_3C_2T_x$ (T: O, F or OH).

In an implementation, the third 2D material layer 340 may include a material represented by a chemical formula MXY (in which M may be Ti, Sn, Pt, Ga, In, Zr, or Hf, and each of X and Y may independently be H, N, Cl, Br, I, O, S, Se, or Te).

In an implementation, M may be Ti, and each of X and Y may independently be Cl, Br, or I. In an implementation, M may be Sn or Pt, and each of X and Y may independently be O, S, Se, or T. In an implementation, M may be Ga or In, and each of X and Y may independently be S, Se, or Te. In an implementation, M may be Ti, Zr, or Hf, and each of X and Y may independently be O, S, or Se.

In the channel structure 159 in the semiconductor device, only the first 2D material layer 140 may serve as a channel, and the third and fourth 2D material layers 340 and 345 do not serve as a channel.

Figure 20:
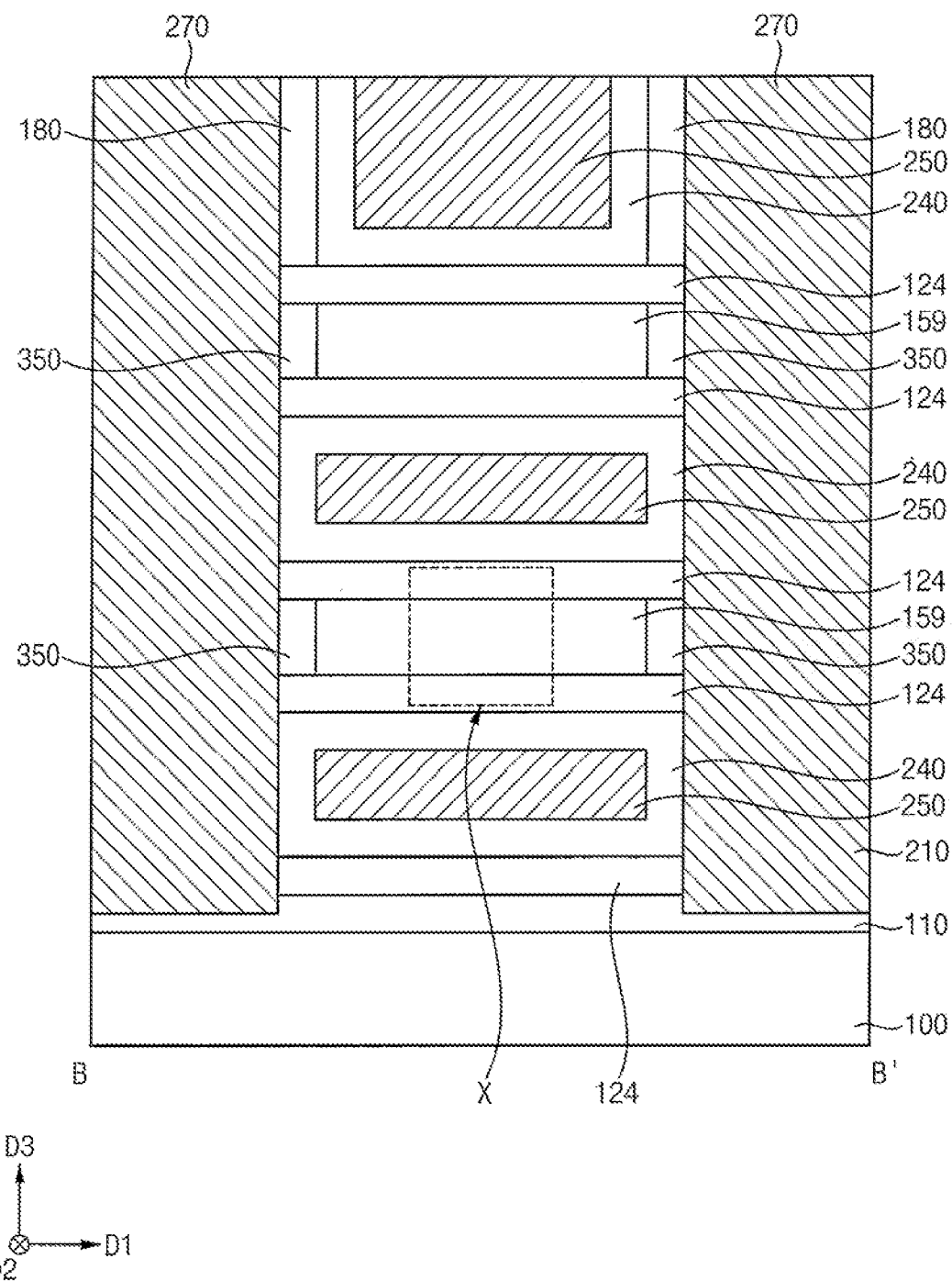
FIG. 20 is a cross-sectional view of a semiconductor device in accordance with example embodiments.

FIG. 20 is a cross-sectional view illustrating a semiconductor device in accordance with example embodiments. This semiconductor device may be substantially the same as or similar to that of FIGS. 1 to 5, except for not including the buffer pattern 260 but including a contact layer.

Referring to FIG. 20, a contact layer 350 may be on each of opposite sidewalls (in the first direction D1) of the channel structure 159, and the contact layer 350 may be between the source/drain layer 270 including a metal and the channel structure 159 including a semiconducting 2D material.

The contact layer 350 may be formed by removing the first chalcogen elements 12 at opposite lateral portions of the first 2D material layer 140 included in the channel structure 159, and thus may have dangling bonds. In an implementation, even though the buffer pattern 260 is not located between the source/drain layer 270 and the channel structure 159, a metal included in the source/drain layer 270 and the first transition metal 10 included in the contact layer 350 may be bonded with each other by a covalent bond, so that the contact resistance between the channel structure 159 and the source/drain layer 270 may decrease.

By way of summation and review, a channel including a two-dimensional (2D) material having a high mobility has been considered. It may be difficult to form other layers on the channel including a 2D material.

One or more embodiments may provide a semiconductor device having improved characteristics.

One or more embodiments may provide a transistor.

In the semiconductor device in accordance with example embodiments, the gate insulation pattern may have a desired thin thickness, and surface scattering may decrease. Thus, the mobility of the semiconductor device may increase, and the reliability of the semiconductor device may enhance. Additionally, some portions of the channel and the gate insulation pattern in the semiconductor device may be bonded with each other by a covalent bond, and thus the adhesion between the channel and the gate insulation pattern may increase.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   channel structures on a substrate, the channel structures being spaced apart from each other in a vertical direction substantially perpendicular to an upper surface of the substrate;
   a lower first gate insulation pattern contacting a lower surface of each of the channel structures;
   an upper first gate insulation pattern contacting an upper surface of each of the channel structures;
   a gate electrode on the substrate, the gate electrode surrounding lower and upper surfaces and a sidewall of a portion of each of the channel structures; and
   source/drain electrodes at opposite sides, respectively, of the gate electrode,
   wherein:
   each of the channel structures includes a first two-dimensional (2D) material layer and a second 2D material layer stacked in the vertical direction,
   the first 2D material layer includes a semiconducting transition metal dichalcogenide (TMD), the semiconducting TMD containing a first transition metal and first chalcogen elements bonded with lower and upper portions, respectively, of the first transition metal,
   the second 2D material layer includes a second transition metal and a second chalcogen element bonded with a lower portion of the second transition metal, and
   the second transition metal included in the second 2D material layer and some elements included in the upper first gate insulation pattern are bonded with each other by covalent bonds or ionic bonds.

2. The semiconductor device as claimed in claim 1, wherein each of the channel structures includes a plurality of first 2D material layers stacked in the vertical direction.

3. The semiconductor device as claimed in claim 2, wherein a van der Waals gap is present between:
   the first 2D material layer and the second 2D material layer, or
   adjacent first 2D material layers of the plurality of first 2D material layers in the vertical direction.

4. The semiconductor device as claimed in claim 1, wherein:
   the upper first gate insulation pattern includes silicon oxide or a metal oxide, and
   the second transition metal included in the second 2D material layer is bonded with silicon or a metal included in the upper first gate insulation pattern by a covalent bond or an ionic bond.

5. The semiconductor device as claimed in claim 1, wherein:
each of the channel structures further includes a third 2D material layer under the first 2D material layer, the third 2D material layer including a third transition metal and a third chalcogen element, the third chalcogen element being bonded at an upper side of the third transition metal, and
the third transition metal included in the third 2D material is bonded with an element included in the lower first gate insulation pattern by a covalent bond or an ionic bond.

6. The semiconductor device as claimed in claim 5, wherein:
the first transition metal and the third transition metal are the same as each other, and
the first chalcogen elements and the third chalcogen element are the same as each other.

7. The semiconductor device as claimed in claim 5, wherein:
the first transition metal and the third transition metal are the same as each other, and
the first chalcogen elements and the second chalcogen element are the same as each other.

8. The semiconductor device as claimed in claim 1, wherein the semiconducting TMD includes molybdenum disulfide ($MoS_2$), molybdenum diselenide ($MoSe_2$), molybdenum ditelluride ($MoTe_2$), tungsten disulfide ($WS_2$), tungsten diselenide ($WSe_2$), or tungsten ditelluride ($WTe_2$).

9. The semiconductor device as claimed in claim 1, wherein each of the channel structures further includes a third 2D material layer under the first 2D material layer, the third 2D material layer including a metallic TMD.

10. The semiconductor device as claimed in claim 9, wherein the third 2D material layer includes $NbS_2$, $NbSe_2$, $NbTe_2$, $TaS_2$, $TaSe_2$, or $TaTe_2$.

11. The semiconductor device as claimed in claim 1, further comprising a buffer pattern between each of the channel structures and each of the source/drain electrodes, the buffer pattern including a semi-metal.

12. The semiconductor device as claimed in claim 1, further comprising a second gate insulation pattern covering a surface of a portion of the gate electrode, the second gate insulation pattern including a metal oxide,
wherein the second gate insulation pattern contacts the lower first gate insulation pattern and the upper first gate insulation pattern.

13. The semiconductor device as claimed in claim 1, further comprising a protection pattern on a sidewall of each of the channel structures, the protection pattern contacting the lower first gate insulation pattern and the upper first gate insulation pattern and including an oxide.

14. A semiconductor device, comprising:
a substrate;
channels on the substrate, the channels being spaced apart from each other in a vertical direction substantially perpendicular to an upper surface of the substrate;
a lower first gate insulation pattern contacting a lower side of each of the channels;
an upper first gate insulation pattern contacting an upper side of each of the channels;
a first contact layer contacting each of the channels, contacting the upper first gate insulation pattern, and contacting the lower first gate insulation pattern;

a gate electrode on the substrate, the gate electrode surrounding lower surfaces, upper surfaces, and a sidewall of a portion of each of the channels; and
source/drain layers at opposite sides, respectively, of the gate electrode,
wherein:
each of the channels includes a semiconducting transition metal dichalcogenide (TMD), the semiconducting TMD containing a first transition metal and first chalcogen elements, the first chalcogen elements being bonded at a lower side of the first transition metal and being bonded at an upper side of the first transition metal,
the first contact layer is disposed between each of the channels and each of the source/drain layers and includes the first transition metal,
the upper first gate insulation patter includes silicon oxide or a metal oxide, and
the first transition metal included in the first contact layer is bonded with silicon or a metal included in the upper first gate insulation pattern by a covalent bond or an ionic bond.

15. The semiconductor device as claimed in claim 14, wherein each of the channels includes a plurality of two-dimensional (2D) material layers stacked in the vertical direction, each of the plurality of 2D material layers including the semiconducting TMD.

16. The semiconductor device as claimed in claim 14, wherein the first transition metal included in the first contact layer is bonded with a metal included in each of the source/drain layers by a covalent bond.

17. The semiconductor device as claimed in claim 14, wherein the lower first gate insulation pattern includes silicon oxide or a metal oxide, and
wherein the first transition metal included in the first contact layer is bonded with silicon or a metal included in the lower first gate insulation pattern by a covalent bond or an ionic bond.

18. A semiconductor device, comprising:
a substrate;
channel structures on the substrate, the channel structures being spaced apart from each other in a vertical direction substantially perpendicular to an upper surface of the substrate, and each of the channel structures having a first length in a first direction substantially parallel to the upper surface of the substrate;
a lower first gate insulation pattern contacting a lower surface of each of the channel structures, the lower first gate insulation pattern having the first length in the first direction;
an upper first gate insulation pattern contacting an upper surface of each of the channel structures, the upper first gate insulation pattern having the first length in the first direction;
a gate electrode extending in a second direction substantially parallel to the upper surface of the substrate and crossing the first direction on the substrate, the gate electrode surrounding lower and upper surfaces and opposite sidewalls in the second direction of a central portion in the first direction of each of the channel structures;
source/drain layers at opposite sides in the first direction, respectively, of the gate electrode; and
a buffer pattern between each of the channel structures and each of the source/drain layers, the buffer pattern including a semi-metal,
wherein:

each of the channel structures includes a first two-dimensional (2D) material layer and a second 2D material layer stacked in the vertical direction, the first 2D material layer includes a semiconducting transition metal dichalcogenide (TMD), the semiconducting TMD containing a first transition metal and first chalcogen elements, the first chalcogen elements being bonded at a lower side of the first transition metal and being bonded at an upper side of the first transition metal, the second 2D material layer includes a second transition metal and a second chalcogen element, the second chalcogen element being bonded at a lower side of the second transition metal, and the second transition metal included in the second 2D material layer is bonded with an element included in the upper first gate insulation pattern are bonded by a covalent bond or an ionic bond.

19. The semiconductor device as claimed in claim 18, wherein:

each of the channel structures includes a plurality of first 2D material layers stacked in the vertical direction, and a van der Waals gap is present between:
- the first 2D material layer and the second 2D material layer, or
- adjacent first 2D material layers of the plurality of first 2D material layers in the vertical direction.

* * * * *